US012266531B2

(12) United States Patent
Miwa et al.

(10) Patent No.: US 12,266,531 B2
(45) Date of Patent: Apr. 1, 2025

(54) METHOD OF MANUFACTURING SILICON CARBIDE SEMICONDUCTOR DEVICE

(71) Applicant: Mitsubishi Electric Corporation, Tokyo (JP)

(72) Inventors: Junya Miwa, Tokyo (JP); Toshikazu Tanioka, Tokyo (JP); Daisuke Taniguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 439 days.

(21) Appl. No.: 17/590,594

(22) Filed: Feb. 1, 2022

(65) Prior Publication Data

US 2022/0336219 A1 Oct. 20, 2022

(30) Foreign Application Priority Data

Apr. 15, 2021 (JP) .................................. 2021-069009

(51) Int. Cl.
  *H01L 21/00* (2006.01)
  *H01L 21/033* (2006.01)
  (Continued)

(52) U.S. Cl.
  CPC ...... *H01L 21/0465* (2013.01); *H01L 21/0337* (2013.01); *H01L 29/66068* (2013.01);
  (Continued)

(58) Field of Classification Search
  CPC .............. H01L 21/0465; H01L 21/0337; H01L 29/66068
  See application file for complete search history.

(56) References Cited

U.S. PATENT DOCUMENTS 6,049,104 A 4/2000 Hshieh et al.
7,517,807 B1 * 4/2009 Tucker .............. H01L 29/66068
  438/739
(Continued)

FOREIGN PATENT DOCUMENTS

CN 115223873 A * 10/2022 ......... H01L 21/0337
DE 102009021718 A1 11/2009
(Continued)

OTHER PUBLICATIONS

An Office Action; "Notice of Reasons for Refusal," mailed by the Japanese Patent Office on Jan. 30, 2024, which corresponds to Japanese Patent Application No. 2021-069009 and is related to U.S. Appl. No. 17/590,594; with English language translation.
(Continued)

*Primary Examiner* — Laura M Menz
(74) *Attorney, Agent, or Firm* — Studebaker Brackett PLLC

(57) ABSTRACT

A method for manufacturing a silicon carbide semiconductor device according to the technology disclosed in the present specification includes: forming a drift layer on an upper surface of a silicon carbide semiconductor substrate; forming a hard mask on the upper surface of the drift layer by anisotropic etching; and forming a first ion-implanted region in a surface layer of the drift layer by implanting ions into the drift layer in a state in which the hard mask is formed, in which the hard mask includes a sidewall perpendicular to the upper surface of the drift layer.

10 Claims, 24 Drawing Sheets

(51) Int. Cl.
*H01L 21/04* (2006.01)
*H01L 29/66* (2006.01)
*H01L 29/16* (2006.01)
*H01L 29/78* (2006.01)

(52) U.S. Cl.
CPC .... *H01L 29/1608* (2013.01); *H01L 29/66712* (2013.01); *H01L 29/7802* (2013.01)

(56) References Cited

U.S. PATENT DOCUMENTS

| | | | |
|---|---|---|---|
| 10,229,969 B2 * | 3/2019 | Kagawa | H01L 21/0465 |
| 10,714,571 B2 * | 7/2020 | Koyama | H01L 29/0623 |
| 10,811,494 B2 * | 10/2020 | Sdrulla | H01L 29/7802 |
| 11,901,446 B2 * | 2/2024 | Yip | H01L 29/7813 |
| 2004/0211980 A1 | 10/2004 | Ryu | |
| 2009/0117722 A1 * | 5/2009 | Tucker | H01L 21/0337 |
| | | | 257/E21.336 |
| 2009/0289264 A1 | 11/2009 | Matsuki et al. | |
| 2011/0195563 A1 * | 8/2011 | Okuno | H01L 21/0465 |
| | | | 257/E21.135 |
| 2011/0207275 A1 * | 8/2011 | Tanaka | H01L 29/7802 |
| | | | 257/E21.41 |
| 2011/0294278 A1 | 12/2011 | Eguchi et al. | |
| 2012/0184092 A1 | 7/2012 | Ooi et al. | |
| 2013/0146969 A1 | 6/2013 | Fujiwara et al. | |
| 2014/0167151 A1 * | 6/2014 | Yen | H01L 29/7813 |
| | | | 438/270 |
| 2015/0333153 A1 | 11/2015 | Eguchi et al. | |
| 2018/0182887 A1 * | 6/2018 | Tawara | H01L 29/66068 |
| 2018/0323299 A1 * | 11/2018 | Tominaga | H01L 29/66068 |
| 2018/0350602 A1 | 12/2018 | Bartolf et al. | |
| 2018/0358431 A1 * | 12/2018 | Kagawa | H01L 29/1608 |
| 2019/0140047 A1 * | 5/2019 | Sdrulla | H01L 29/41741 |
| 2019/0198663 A1 * | 6/2019 | Sakai | H01L 29/7813 |
| 2019/0237548 A1 * | 8/2019 | Koyama | H01L 29/06 |
| 2019/0288105 A1 * | 9/2019 | Hisada | H01L 29/4236 |
| 2020/0251575 A1 | 8/2020 | Kim et al. | |
| 2020/0251600 A1 * | 8/2020 | Kitai | H01L 29/0619 |
| 2022/0336219 A1 * | 10/2022 | Miwa | H01L 29/66068 |
| 2023/0053874 A1 * | 2/2023 | Yip | H01L 29/66068 |
| 2024/0297247 A1 * | 9/2024 | Kinoshita | H01L 29/66068 |
| 2024/0297248 A1 * | 9/2024 | Kinoshita | H01L 21/0465 |
| 2024/0339502 A1 * | 10/2024 | Moriya | H01L 29/7813 |
| 2024/0387723 A1 * | 11/2024 | Takahashi | H01L 29/0856 |

FOREIGN PATENT DOCUMENTS

| | | | | |
|---|---|---|---|---|
| DE | 102022107081 A1 * | 10/2022 | ......... | H01L 21/0337 |
| JP | 2001-523895 A | 11/2001 | | |
| JP | 2005-229105 A | 8/2005 | | |
| JP | 2006-524433 A | 10/2006 | | |
| JP | 2006295174 A * | 10/2006 | ..... | H01L 21/823807 |
| JP | 2007-242925 A | 9/2007 | | |
| JP | 2020-194880 A | 12/2020 | | |
| JP | 2022163892 A * | 10/2022 | ......... | H01L 21/0337 |
| JP | 7531446 B2 * | 8/2024 | ......... | H01L 21/0337 |
| WO | 99/26296 A2 | 5/1999 | | |
| WO | 2004/097926 A1 | 11/2004 | | |
| WO | WO-2012032735 A1 * | 3/2012 | ......... | H01L 29/0619 |
| WO | 2012/098759 A1 | 7/2012 | | |
| WO | WO-2016199546 A1 * | 12/2016 | ......... | H01L 21/0465 |
| WO | WO-2017081935 A1 * | 5/2017 | ......... | H01L 21/0465 |

OTHER PUBLICATIONS

Office Action issued in DE 10 2022 107 081.6; mailed by the German Patent and Trademark Office on Oct. 23, 2024.

* cited by examiner

F I G. 1
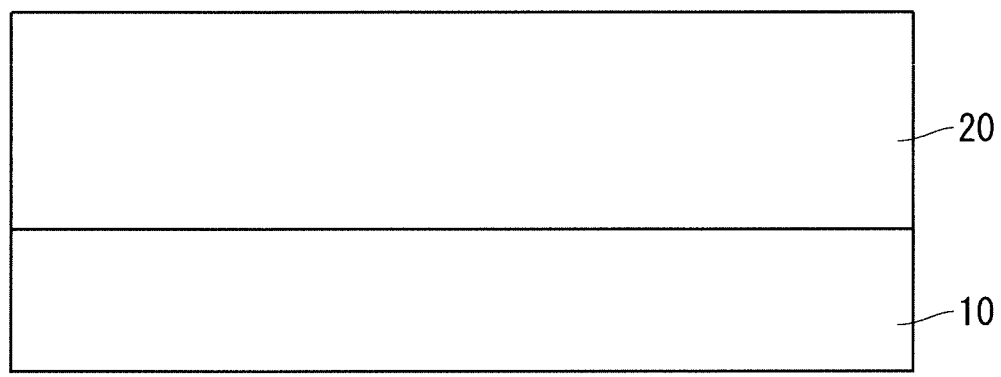

F I G. 2
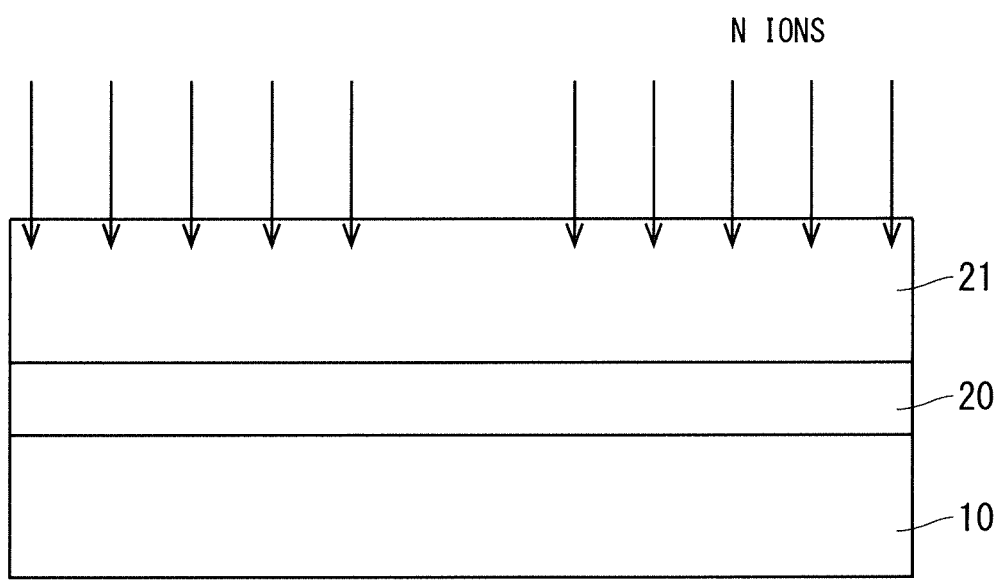

F I G. 6
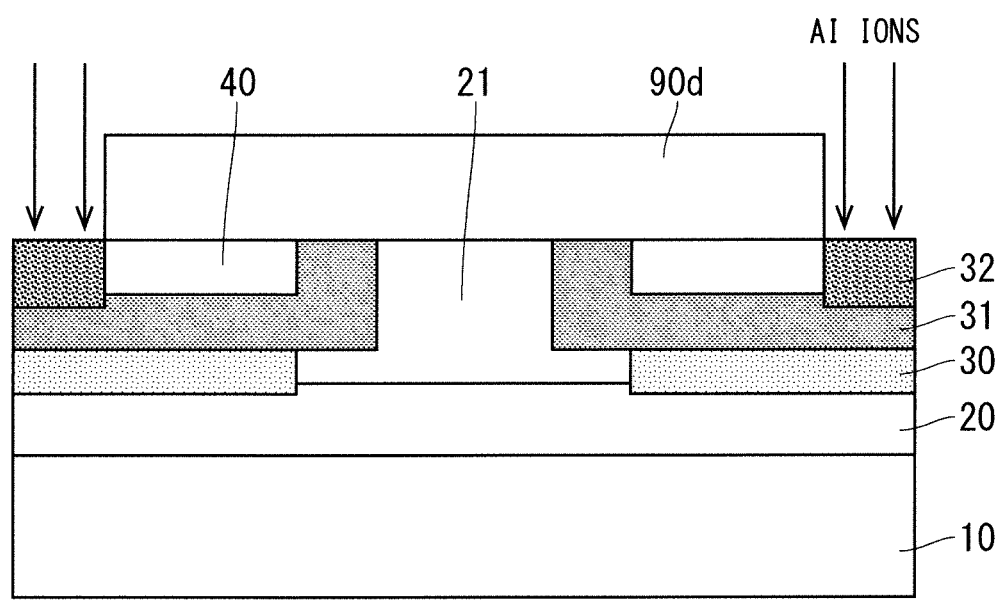

F I G. 7
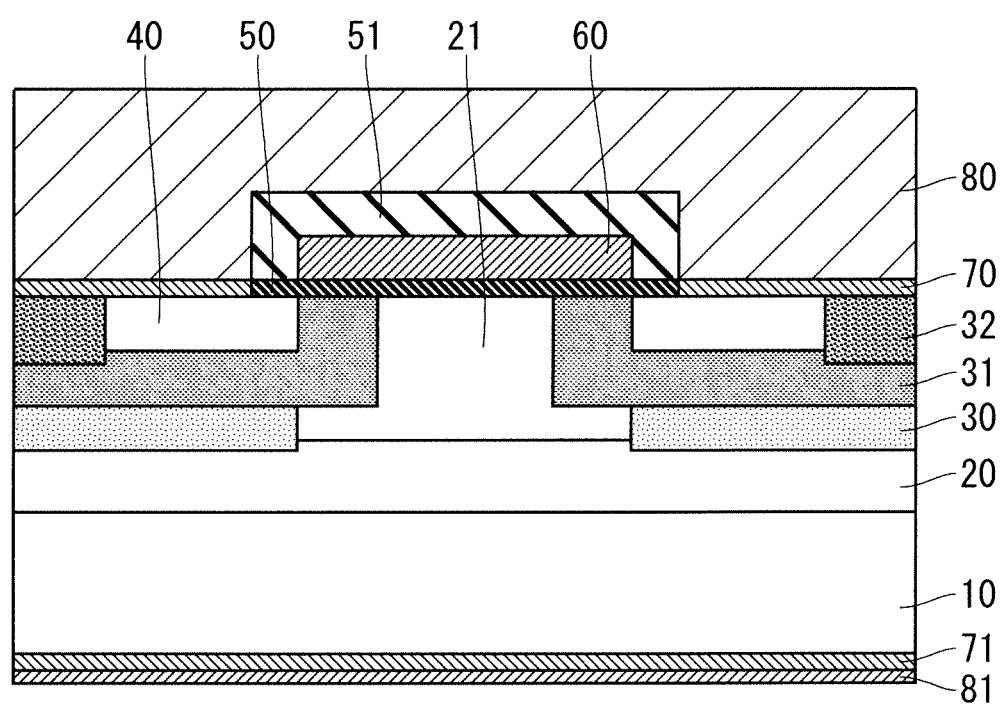

F I G. 1 5
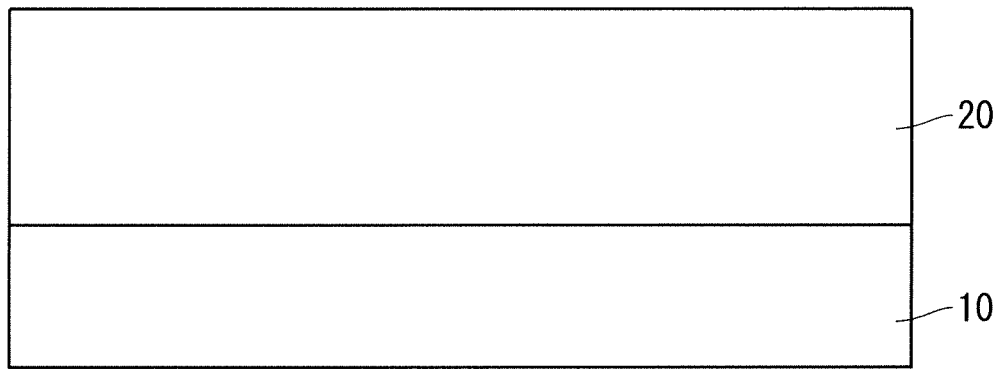

F I G. 1 9
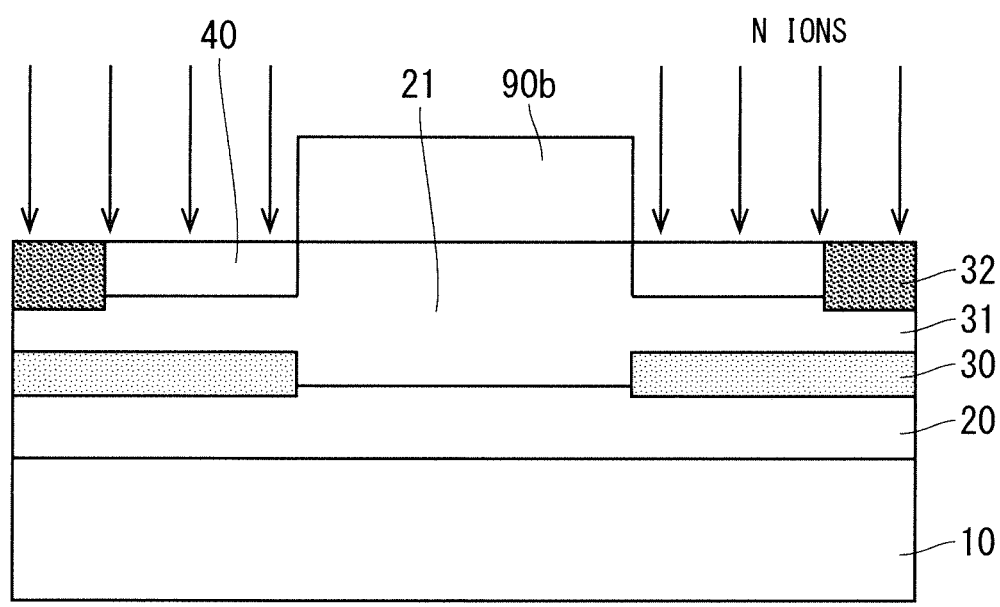

F I G. 2 2
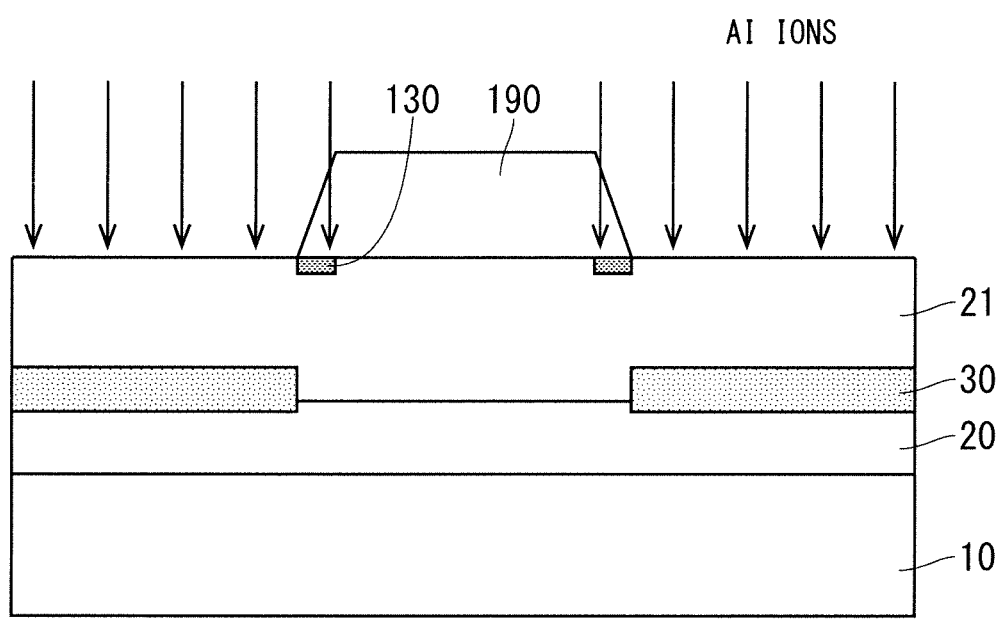

F I G. 2 3
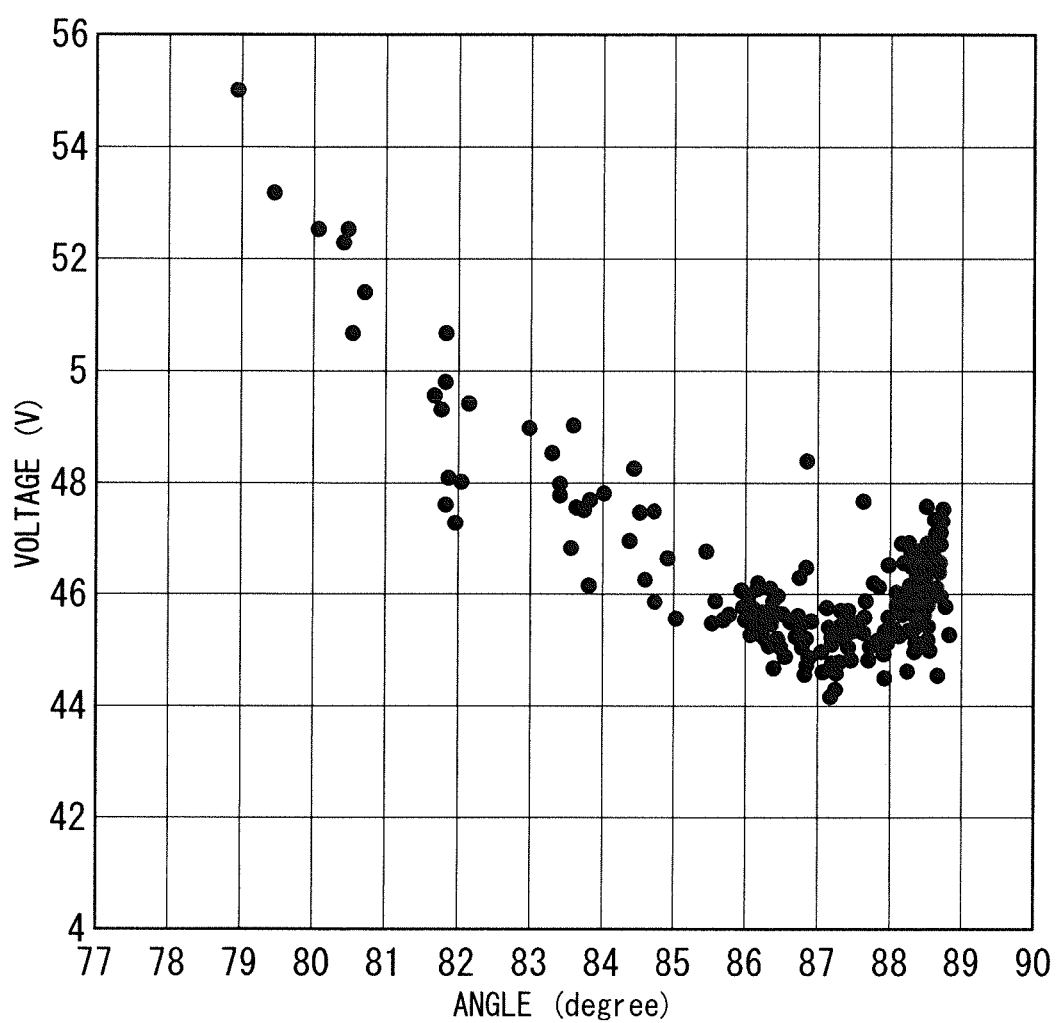

F I G. 2 4
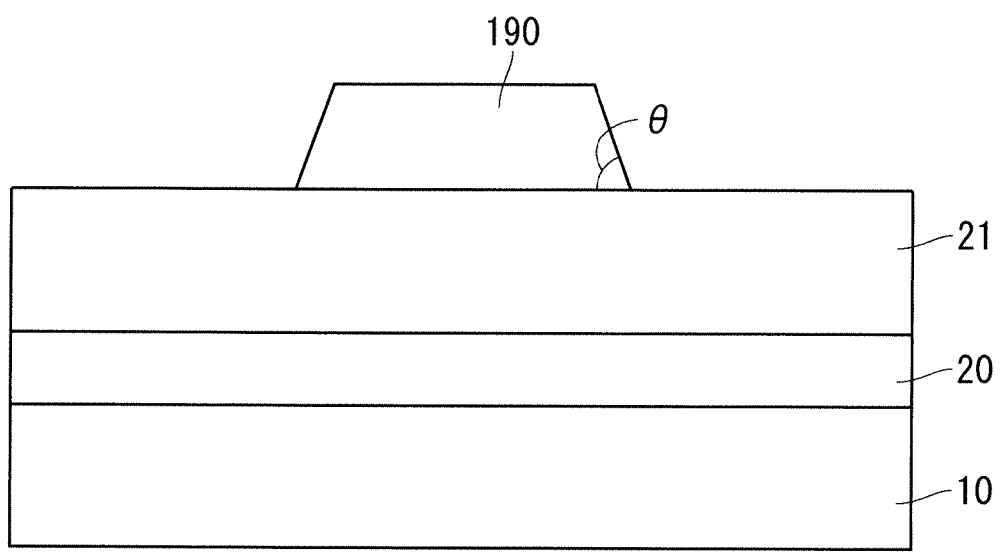

METHOD OF MANUFACTURING SILICON CARBIDE SEMICONDUCTOR DEVICE

BACKGROUND OF THE INVENTION

Field of the Invention

The technology disclosed in the present specification relates to a semiconductor device.

Description of the Background Art

A conventional silicon carbide semiconductor device includes a p-type second well region located below a p-type first well region and having a narrower width than the first well region in order to reduce an electric field intensity at a PN junction while suppressing an increase in on-voltage to reduce the leakage current at the time of OFF. This structure is formed by ion implantation using a mask such as a photoresist (see, for example, WO 2017/081935 A).

As described above, a conventional technique adopts a structure including a p-type second well region located below a p-type first well region and having a narrower width than the first well region in order to reduce the electric field intensity at a PN junction while suppressing an increase in on-voltage to reduce the leakage current at the time of OFF.

The above structure is formed by ion implantation using a photoresist mask. A photoresist mask may have a forward tapered shape spreading downward due to defocus during photolithography caused by the low flatness of a silicon carbide semiconductor substrate.

The ions implanted through the forward tapered portion as described above are implanted to a depth shallower than the target depth. This increases the impurity concentration of the surface layer of the first well region.

The impurity concentration of the surface layer of the first well region greatly influences the mobility of the channel. Accordingly, there is a problem that variations in electrical characteristics of the semiconductor device such as an increase in threshold voltage or an increase in on-voltage occur.

SUMMARY

Variations in electrical characteristics of a semiconductor device caused by ion implantation are suppressed.

A method for manufacturing a silicon carbide semiconductor device which is the first aspect of the technology disclosed in the present specification includes forming a drift layer on an upper surface of a silicon carbide semiconductor substrate, forming a hard mask on an upper surface of the drift layer by anisotropic etching, and forming a first ion implantation region in a surface layer of the drift layer by implanting ions into the drift layer in a state in which the hard mask is formed, wherein the hard mask comprises a sidewall perpendicular to the upper surface of the drift layer.

According to at least the first aspect of the technology disclosed in the present specification, performing ion implantation using a hard mask having a sidewall having high perpendicularity makes it possible to suppress implantation of implanted ions to a depth shallower than a target depth. Therefore, an increase in the threshold voltage or the on-voltage can be effectively suppressed. This can suppress variations in the electrical characteristics of the semiconductor device.

Objects, features, aspects, and advantages associated with the technology disclosed in the present specification will be more obvious from the following detailed description and the accompanying drawings.

These and other objects, features, aspects and advantages of the present specification will become more apparent from the following detailed description of the present disclosure when taken in conjunction with the accompanying drawings.

BRIEF DESCRIPTION OF THE DRAWINGS

FIG. 1 to FIG. 21 are cross-sectional views illustrating an example of a method for manufacturing a silicon carbide semiconductor device according to a preferred embodiment;

FIG. 22 is a cross-sectional view illustrating an example of the shape of a photoresist mask;

FIG. 23 is a diagram illustrating an experimental result obtained when the sidewall angle of the implantation mask is changed; and FIG. 24 is a view illustrating a definition of an angle of a sidewall of the implantation mask.

DESCRIPTION OF THE PREFERRED EMBODIMENTS

Figure 3:
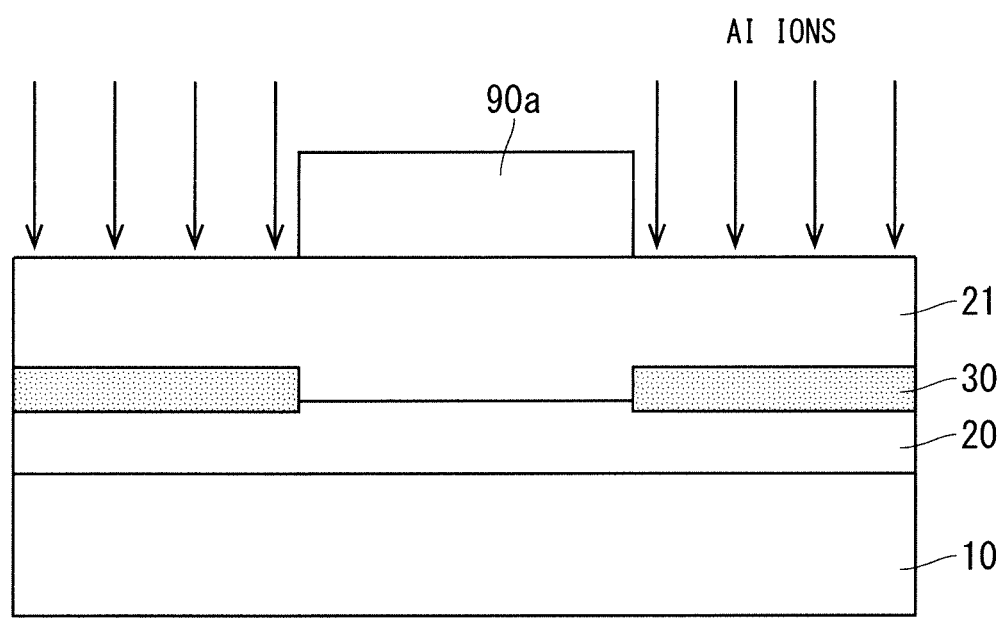

Preferred embodiments will be described below with reference to the accompanying drawings. In the following preferred embodiments, detailed features and the like are also illustrated for the description of the technology, but they are merely examples, and not all of them are necessarily essential features for enabling the preferred embodiments to be carried out.

Note that the drawings are schematically illustrated, and omission of the configuration or simplification of the configuration is appropriately made in the drawings for convenience of description. In addition, the mutual relationship in size and position of the configurations and the like illustrated in different drawings is not necessarily accurately described and can be appropriately changed. Hatching may be applied to a drawing such as a plan view that is not a cross-sectional view in order to facilitate understanding of the contents of the preferred embodiment.

In the following description, similar constituent elements are denoted by the same reference numerals, and names and functions of them are also similar. Accordingly, a detailed description of each of them is sometimes omitted in order to avoid duplication.

In the description of the present specification, the expression "comprising", "including", "having", or the like a certain constituent element is not an exclusive expression excluding the presence of other constituent elements unless otherwise specified.

In addition, in the description of the present specification, even if ordinal numbers such as "first" and "second" are used, these terms are used for convenience to facilitate understanding of the contents of the preferred embodiments, and the contents of the preferred embodiments are not limited to the order or the like that can be caused by these ordinal numbers.

In addition, in the description of the present specification, expressions indicating a relative or absolute positional relationship, for example, "in one direction", "along one direction", "parallel", "orthogonal", "center", "concentric", and "coaxial" include a case in which the positional relationship is strictly indicated and a case in which an angle or a distance is displaced within a range in which a tolerance or a similar function is obtained, unless otherwise specified.

In addition, in the description of the present specification, an expression indicating an equal state, for example, "same", "equal", "uniform", or "homogeneous" includes a case indicating a strictly equal state and a case in which a difference occurs within a range in which a tolerance or a similar function can be obtained, unless otherwise specified.

In addition, in the description of the present specification, even if terms meaning specific positions or directions such as "upper", "lower", "left", "right", "side", "bottom", "front", or "back" are used, these terms are used for convenience to facilitate understanding of the contents of the preferred embodiment, and are not related to the positions or directions e the preferred embodiment is actually implemented.

Furthermore, in the description of the present specification, the description "the upper surface of", "the lower surface of", or the like includes a state in which another constituent element is formed on the upper surface or the lower surface of a target constituent element in addition to the upper surface itself or the lower surface itself of the target constituent element. That is, for example, the expression "constituent element B provided on the upper surface of constituent element A" does not preclude the presence of "another constituent element C" between constituent elements A and B.

First Preferred Embodiment

A method for manufacturing a silicon carbide semiconductor device according to the present preferred embodiment will be described below.

In the following description, regarding the conductivity types of impurities, it is assumed that the first conductivity type is n type and the second conductivity type is p type.

FIG. 22 is a cross-sectional view illustrating an example of the shape of a photoresist mask. The above structure is formed by ion implantation using a photoresist implantation mask 190. The photoresist implantation mask 190 has a forward tapered shape spreading downward due to defocus during photolithography caused by the low flatness of a silicon carbide semiconductor substrate.

The ions implanted in the forward tapered portion (that is, an end portion of the implantation mask 190) of the implantation mask 190 are implanted to a depth shallower than the target depth. Accordingly, an impurity region 130 formed at a depth shallower than the target depth is formed separately from a well region 30 formed at the target depth, and the impurity concentration of the surface layer of a JFET region 21 increases.

FIG. 23 is a diagram illustrating an experimental result obtained when the sidewall angle of the implantation mask is changed. The implantation mask used in the experiment illustrated in FIG. 23 is a photoresist mask. In the experiment illustrated in FIG. 23, the inventors change the sidewall angle of the implantation mask by changing photolithography conditions in the silicon carbide semiconductor device.

Referring to FIG. 23, the ordinate represents the threshold voltage [V] of the silicon carbide semiconductor device, and the abscissa represents the angle [°] of the sidewall with respect to the substrate surface of the implantation mask. The value on the abscissa in FIG. 23 is the value of an angle θ calculated from the dimension actually measured using a scanning electron microscope (SEM). The value on the ordinate in FIG. 23 is the actual measurement value of a threshold voltage.

FIG. 24 is a view illustrating a definition of the angle of a sidewall of the implantation mask 190. As illustrated in FIG. 24, the angle of the sidewall of the implantation mask 190 is the angle with respect to the upper surface of the JFET region 21 and is denoted as angle θ.

Based on FIGS. 23 and 24, the inventors have newly found that the threshold voltage increases as the angle θ becomes smaller than 87°, and that the threshold voltage becomes substantially constant in a range in which the angle θ is 87° or more and 89° or less.

The silicon carbide semiconductor substrate is a material that is difficult to process. In addition, since the silicon carbide semiconductor substrate contains many crystal defects, local warpage is likely to occur due to residual stress. For these reasons, the flatness of the upper surface of the silicon carbide semiconductor substrate is reduced.

When the impurity concentration of the surface layer of the drift layer of the first well region increases, the on-voltage also increases. Therefore, the on-voltage also exhibits similar dependency on the angle θ.

Note that, in a range in which the angle θ whose measured value is not illustrated in FIG. 23 is 89° or more and 90° or less, it is considered that the behavior is similar to the behavior in a range in which the angle θ is 87° or more and 89° or less.

When the angle θ is within the range of 87° or more and 89° or less, variations in electrical characteristics of the semiconductor device can be suppressed. However, since the silicon carbide semiconductor substrate has low flatness as described above, there may be a portion where the angle θ of the sidewall of the implantation mask 190 is less than 87°.

Therefore, in the present preferred embodiment, anisotropic etching is performed by dry etching to form an implantation mask with a sidewall angle being vertical. Performing ion implantation using the implantation mask will suppress variations in electrical characteristics of the semiconductor device.

Note that the word "vertical" includes a case of strictly vertical and a case in which the angle is displaced within a range in which a tolerance or a similar function can be obtained.

<Configuration of Silicon Carbide Semiconductor Device and Method for Manufacturing the Same>

FIGS. 1 to 7 each are a cross-sectional view illustrating an example of a method for manufacturing a silicon carbide semiconductor device according to the present preferred embodiment.

Referring to FIG. 1, first of all, an n-type low-resistance silicon carbide semiconductor substrate 10 of the 4H polytype, with the plane orientation of the first principal surface being (0001) is prepared. On the upper surface of silicon carbide semiconductor substrate 10, a drift layer 20 having an n-type impurity concentration of, for example, $1 \times 10^{15}$ $cm^{-3}$ or more and $1 \times 10^{17}$ $cm^{-3}$ or less and a thickness of, for example, 5 μm or more and 50 μm or less is epitaxially grown by a chemical vapor deposition (chemical vapor deposition, i.e. CVD) method.

Referring to FIG. 2, N (nitrogen) as an n-type impurity is ion-implanted into the surface layer of the drift layer 20 to form the n-type JFET region 21 in the surface layer of the drift layer 20. At this time, the depth of the ion implantation of N is set not to exceed the depth of the well region 30 formed in a later step. The JFET region 21 has an impurity concentration higher than that of the drift layer 20.

Ion implantation of N may be performed on the entire surface of the drift layer 20 or may be performed only on an active region by limiting the range using a photomask or the like.

Referring to FIG. 3, a mask material is then formed on the upper surface of the JFET region 21 by a CVD method or the like. The type of mask material used here is not a photoresist but silicon oxide ($SiO_2$) or silicon nitride (SiN) serving as a hard mask.

A photoresist mask (that is, an etching mask for a mask material) is separately formed on the upper surface of the mask material, and an implantation mask 90a made of the mask material is formed by anisotropic etching such as dry etching. Note that the etching mask may be a hard mask instead of a photoresist mask. The perpendicularity of the sidewall of the implantation mask 90a (that is, the degree of perpendicularity between the sidewall of the implantation mask 90a and the upper surface of the JFET region 21, which is the surface with which the lower surface of the implantation mask 90a is in contact) is preferably high (i.e., vertical including substantially vertical).

Al ions of a p-type impurity are implanted into the JFET region 21 having an upper surface on which the implantation mask 90a is formed to form the p-type well region 30 (electric field relaxation structure). The depth of the ion implantation of Al does not exceed the depth of the drift layer 20 and may be, for example, a depth having a peak of 0.6 μm or more and 4 μm or less. The impurity concentration of ion-implanted Al is higher than the n-type impurity concentration of drift layer 20. After ion implantation of Al, the implantation mask 90a is removed.

Note that the p-type impurity concentration of Al ions implanted shallower than a desired depth (in particular, implanted into the surface layer of the JFET region 21 and its vicinity) is low enough not to influence the electrical characteristics (that is, the threshold voltage, on-voltage, or the like) of the semiconductor device.

It is difficult to maintain the perpendicularity of the sidewall of the photoresist mask due to a focus shift during photolithography caused by the low flatness of the silicon carbide semiconductor substrate. On the other hand, as described in the present preferred embodiment, etching of the sidewall of the implantation mask 90a, which is a hard mask formed by anisotropic etching such as dry etching, is suppressed by the protection of the sidewall by reaction products, and hence the perpendicularity of the sidewall is high.

In this case, for the reason why the sidewall is protected by the reaction products, reference can be made to, for example, the reference literature (Fundamentals of Etching Technology, Fusao Shimokawa, Journal of the Japan Society of Precision Engineering, Vol. 77, No. 2 2011, pp. 162-168).

Section 3.3 "Role of Ions in Dry Etching" of the above reference literature describes that "Next, in addition to promotion of such a surface reaction by ion-assist, an important role of ions in dry etching is directional etching by directional control of ions. When only a gas or radicals are used, the obtained shape is basically isotropic. In contrast to this, when ions are simultaneously applied, a directional shape can be formed. In this case, by selecting a gas type in consideration of the reactivity described in the previous section and increasing a selectivity that is the etching rate ratio between a mask material and a material to be processed, a processed shape with better perpendicularity can be formed. A sidewall protective film is important for implementing this directional (perpendicular) etching. The reference literature goes like this: "Sidewall protective films include 1. a nonvolatile reaction product generated in the etching process, 2. a sputter redeposition film of a resist (mask), and 3. a plasma polymerized film (fluorocarbon film) generated in the separation or recombination process of an etching gas. These sidewall protective films prevent or suppress the etching reaction due to radicals or ions. As a result, the perpendicularity of the etching shape is improved.".

According to the description of the above reference literature, the sidewall protective film generated by, for example, "1", "2", or "3" prevents or suppresses the etching reaction by radicals or ions and consequently improves the perpendicularity of the etching shape.

In the present preferred embodiment, when a mask such as an oxide film is formed, for example, etching using plasma of a CF-based gas is performed on the oxide film, so that a fluorocarbon-based polymer which is a reaction product of the etching becomes a sidewall protective film. It is considered that a mask having an etching shape with high perpendicularity can be formed, similarly to the description of the above reference literature.

Conventionally, the sidewall of the implantation mask is tapered at the time of ion implantation and is buffered by the tapered portion, so that the depth of ion implantation becomes shallower than a desired depth. As a result, the electrical characteristics of the semiconductor device may vary.

In contrast to this, in the case of the implantation mask 90a described in the present preferred embodiment, implanted ions are implanted at a desired depth or concentration, and the desired well region 30 is formed with high accuracy. Accordingly, variations in the electrical characteristics of the semiconductor device, such as an increase in threshold voltage or on-voltage can be suppressed.

Figure 4:
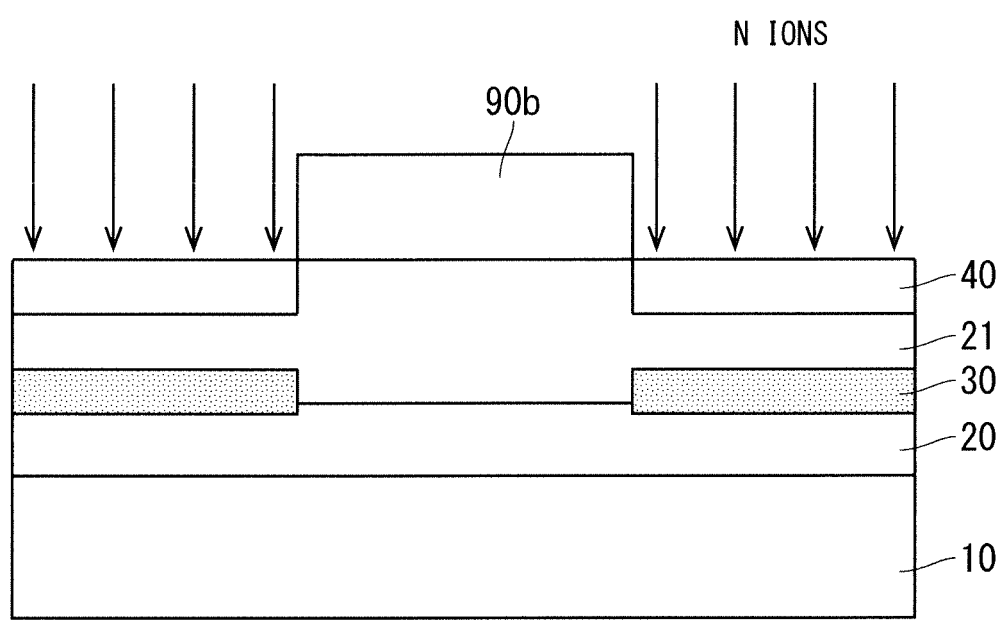

Referring to FIG. 4, an implantation mask 90b is formed on the upper surface of the JFET region 21 after removal of the implantation mask 90a. The implantation mask 90b is, for example, a hard mask formed by anisotropic etching such as dry etching. The perpendicularity of the sidewall of the implantation mask 90b (that is, the degree of perpendicularity between the sidewall of the implantation mask 90b and the upper surface of the JFET region 21, which is the surface with which the lower surface of the implantation mask 90b is in contact) is preferably high (i.e., vertical including substantially vertical).

An n-type source region 40 is formed as a counter doped layer in the surface layer of the JFET region 21 by ion-implanting N as an n-type impurity into the JFET region 21 in a state in which the implantation mask 90b is formed on the upper surface. The source region 40 has a higher impurity concentration than the JFET region 21. At this time, the depth of the ion implantation of N is assumed to be shallower than the depth of a well region 31 formed in the subsequent step. The impurity concentration of the implanted N is, for example, in the range of $1\times10^{18}$ $cm^3$ or more and $1\times10^{21}$ $cm^{-3}$ or less and exceeds the p-type impurity concentration of the well region 31. After ion implantation of N, the implantation mask 90b is removed.

Note that the implantation mask 90a illustrated in FIG. 3 may be used instead of the implantation mask 90b. In this case, the implantation mask 90b is not formed in the stage in FIG. 4 without removing the implantation mask 90a formed in FIG. 3. Using the implantation mask 90a also at the time of forming the source region 40 can reduce the number of masks and the manufacturing cost.

The electrical characteristics of the semiconductor device can be stabilized by using the implantation mask 90b having high perpendicularity also at the time of forming the source region 40.

Figure 5:
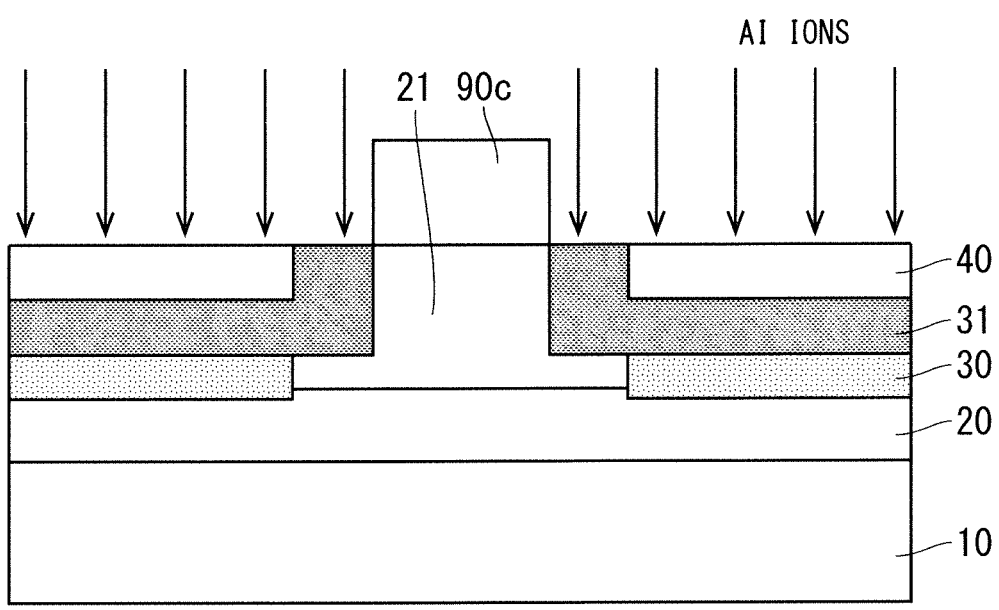

Referring to FIG. 5, an implantation mask 90c is formed on the upper surface of the JFET region 21 after removal of the implantation mask 90b. The implantation mask 90c is, for example, a hard mask formed by anisotropic etching such as dry etching. The perpendicularity of the sidewall of the implantation mask 90c (that is, the degree of perpendicularity between the sidewall of the implantation mask 90c and the upper surface of the JFET region 21, which is the surface with which the lower surface of the implantation mask 90c is in contact) is preferably high (i.e., vertical including substantially vertical).

The p-type well region 31 is formed in the surface layer of the JFET region 21 by ion-implanting Al as a p-type impurity into the JFET region 21 in a state in which the implantation mask 90c is formed on the upper surface. At this time, the depth of Al ion implantation does not exceed the depth of the drift layer 20 and is, for example, 0.5 μm or more and 3 μm or less. Referring to FIG. 5, the well region 31 is formed deeper than the source region 40 and shallower than the well region 30. The impurity concentration of the implanted Al is, for example, in the range of $1 \times 10^{17}$ cm$^{-3}$ or more and $1 \times 10^{19}$ cm$^{-3}$ or less and exceeds the n-type impurity concentration of the drift layer 20.

After Al is ion-implanted, N ions may be implanted into a shallow region where a channel is formed in the well region 31 in order to adjust the threshold voltage. Implanting N ions into the shallow region where the channel is formed will increase the impurity concentration of the region where the channel is formed and hence can achieve a high threshold voltage.

Instead of the implantation mask 90c, the implantation mask 90a illustrated in FIG. 3 or the implantation mask 90b illustrated in FIG. 4 may be sized to have a desired width by photolithography and anisotropic etching such as dry etching. In that case, these implantation masks are not removed in the corresponding processes.

The electrical characteristics of the semiconductor device can be stabilized by using the implantation mask 90c having high perpendicularity also at the time of forming the well region 31. In addition, since the implantation of N ions into the shallow region where the channel is formed has a large influence on the electrical characteristics of the semiconductor device, the use of the implantation mask 90c having high perpendicularity can greatly contribute to the stabilization of the electrical characteristics of the semiconductor device.

Referring to FIG. 6, after the removal of the implantation mask 90c, an implantation mask 90d is formed across the upper surface of the JFET region 21, the upper surface of the well region 31, and the upper surface of the source region 40. The implantation mask 90d is, for example, a hard mask formed by anisotropic etching such as dry etching. The perpendicularity of the sidewall of the implantation mask 90d (that is, the degree of perpendicularity between the sidewall of the implantation mask 90d and the upper surface of the source region 40, which is the surface with which the lower surface of the implantation mask 90d is in contact) is preferably high (i.e., vertical including substantially vertical).

A p-type well contact region 32 is formed in the surface layer of the well region 31 by ion-implanting Al, which is a p-type impurity, into the source region 40 in a state in which the implantation mask 90d is formed on the upper surface.

At this time, the depth of Al ion implantation is between the depth of the source region 40 and the depth of the well region 31. When Al is ion-implanted, it is preferable to heat the silicon carbide semiconductor substrate 10, on which the drift layer 20 is formed, to 150° C. or higher in order to reduce the resistance of the well contact region 32. Accordingly, the implantation mask 90d is preferably a hard mask formed of silicon oxide or the like and patterned in a predetermined shape. After ion implantation of Al, the implantation mask 90d is removed.

Referring to FIG. 7, an annealing treatment is performed in an atmosphere of an inert gas (argon (Ar) gas or the like) at, for example, 1300° C. or higher and 1900° C. or lower for, for example, 30 seconds or longer and 1 hour or shorter by a heat treatment apparatus (not illustrated). This activates ion-implanted Al and N.

A gate oxide film 50 is formed by thermal oxidation across the upper surface of the JFET region 21, the upper surface of the well region 31, and the upper surface of the source region 40. A polycrystalline silicon film having conductivity is formed on the upper surface of the gate oxide film 50. Further, a gate electrode 60 is formed by patterning the gate oxide film 50 and the polycrystalline silicon film.

Then, an interlayer insulating film 51 is formed so as to cover the gate electrode 60. A contact hole between the well contact region 32 and the source region 40 is formed by patterning.

Next, a metal film of nickel (Ni) or the like covering the interlayer insulating film 51, the well contact region 32, and the source region 40 is formed by a sputtering method, and heat treatment is performed at a temperature of, for example, 600° C. or higher and 1100° C. or lower. This forms a silicide between the silicon carbide layer and the metal film by causing Ni to react with silicon carbide. Subsequently, a metal film other than the silicide remaining on the upper surface of the interlayer insulating film 51 is removed by wet etching using a liquid mixture of a sulfuric acid hydrogen peroxide solution or the like. Performing this processing will form an ohmic electrode 70 on the upper surface side. The ohmic electrode 70 is formed to cover the well contact region 32 and the source region 40.

Metal wiring such as AlSi covering the interlayer insulating film 51 and the ohmic electrode 70 is formed by a sputtering method and further patterned to form a source electrode 80.

A metal film of Ti or the like covering the lower surface of the silicon carbide semiconductor substrate 10 is then formed by a sputtering method, and heat treatment is further performed to form an ohmic electrode 71 on the lower surface side. In addition, a drain electrode 81 is formed on the lower surface of the ohmic electrode 71 by sputtering Ni—Au. This completes the configuration of the silicon carbide semiconductor device.

Second Preferred Embodiment

A method for manufacturing a silicon carbide semiconductor device according to the present preferred embodiment will be described below. Note that, in the following description, constituent elements similar to the constituent elements described in the preferred embodiment described above are denoted by the same reference numerals, and detailed description thereof will be omitted as appropriate.

<Configuration of Silicon Carbide Semiconductor Device and Method for Manufacturing the Same>

FIGS. 8 to 14 each are a cross-sectional view illustrating an example of a method for manufacturing a silicon carbide semiconductor device according to the present preferred embodiment. Note that a difference between the second preferred embodiment and the first preferred embodiment is that an active region and a dicing line in a silicon carbide semiconductor substrate are illustrated in FIGS. 8 to 14, and an alignment mark 100 for mask alignment is formed on the dicing line.

Figure 8:
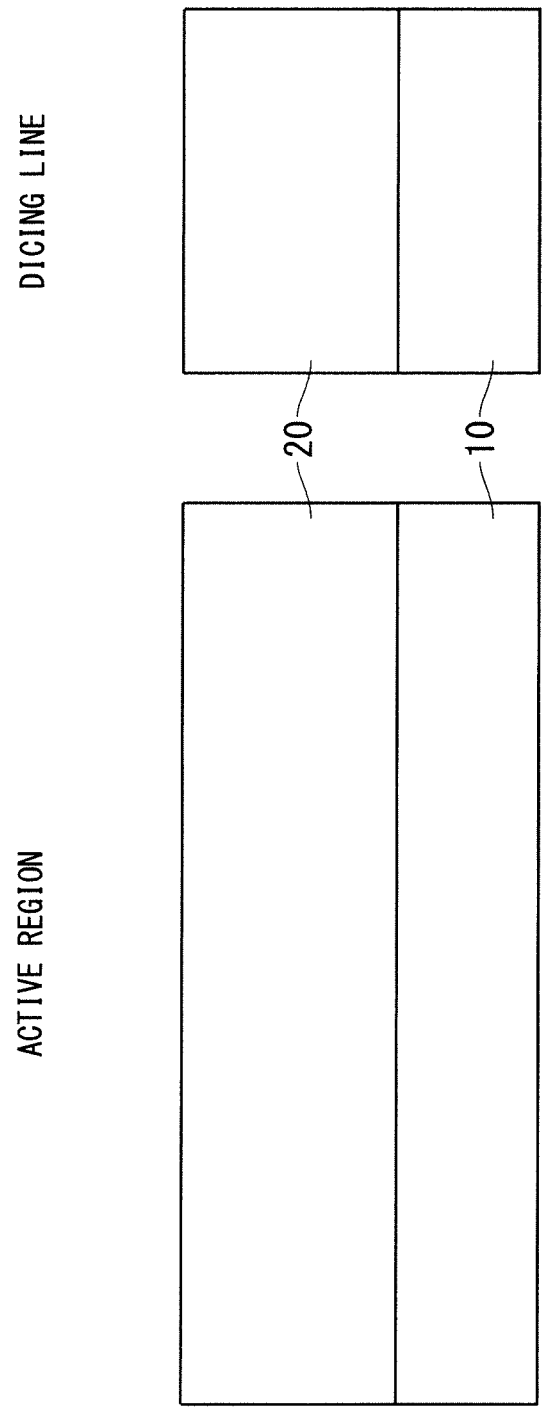

Referring to FIG. 8, first of all, on the upper surface of a silicon carbide semiconductor substrate 10, a drift layer 20 having an n-type impurity concentration of, for example, $1 \times 10^{15}$ cm$^{-3}$ or more and $1 \times 10^{17}$ cm$^{-3}$ or less and a thickness of, for example, 5 μm or more and 50 μm or less is epitaxially grown by the CVD method.

Figure 9:
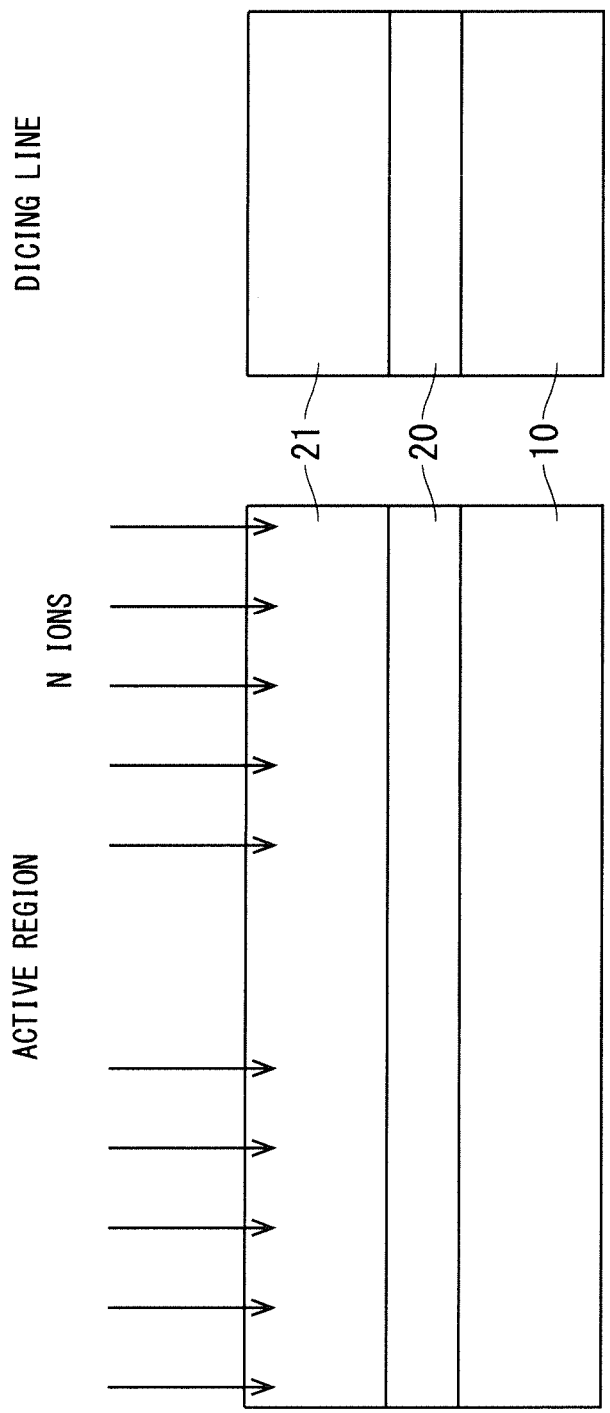

Referring to FIG. 9, N (nitrogen) as an n-type impurity is ion-implanted into the surface layer of a drift layer 20 to form the n-type JFET region 21 in the surface layer of the drift layer 20. At this time, the depth of the ion implantation of N is set not to exceed the depth of the well region 30 formed in a later step.

Figure 10:
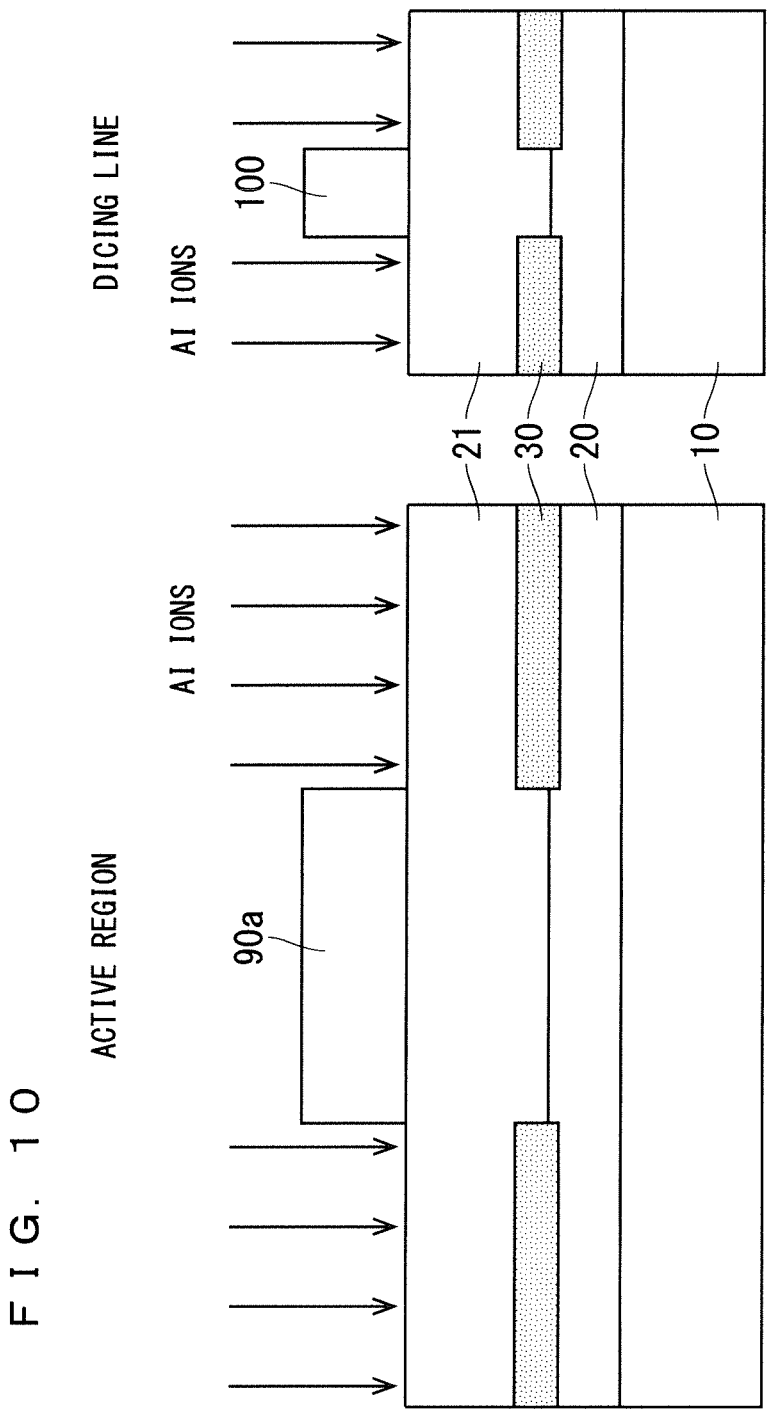

Referring to FIG. 10, a mask material is then formed on the upper surface of a JFET region 21 by a CVD method or the like. The type of mask material used here is not a photoresist but silicon oxide (SiO$_2$) or silicon nitride (SiN) serving as a hard mask.

A photoresist mask (that is, an etching mask for a mask material) is separately formed on the upper surface of the mask material, and an implantation mask 90a made of the mask material is formed by anisotropic etching such as dry etching. Note that the etching mask may be a hard mask instead of a photoresist mask. Furthermore, the perpendicularity of the sidewall of the implantation mask 90a is preferably high (i.e., vertical including substantially vertical). At this time, the alignment mark 100 is also formed on the dicing line.

Al ions of a p-type impurity are implanted into the JFET region 21 having an upper surface on which the implantation mask 90a is formed to form the p-type well region 30. The depth of the ion implantation of Al does not exceed the depth of the drift layer 20 and may be, for example, a depth having a peak of 0.6 μm or more and 4 μm or less. The impurity concentration of ion-implanted Al is higher than the n-type impurity concentration of drift layer 20. After ion implantation of Al, the implantation mask 90a is removed.

Figure 11:
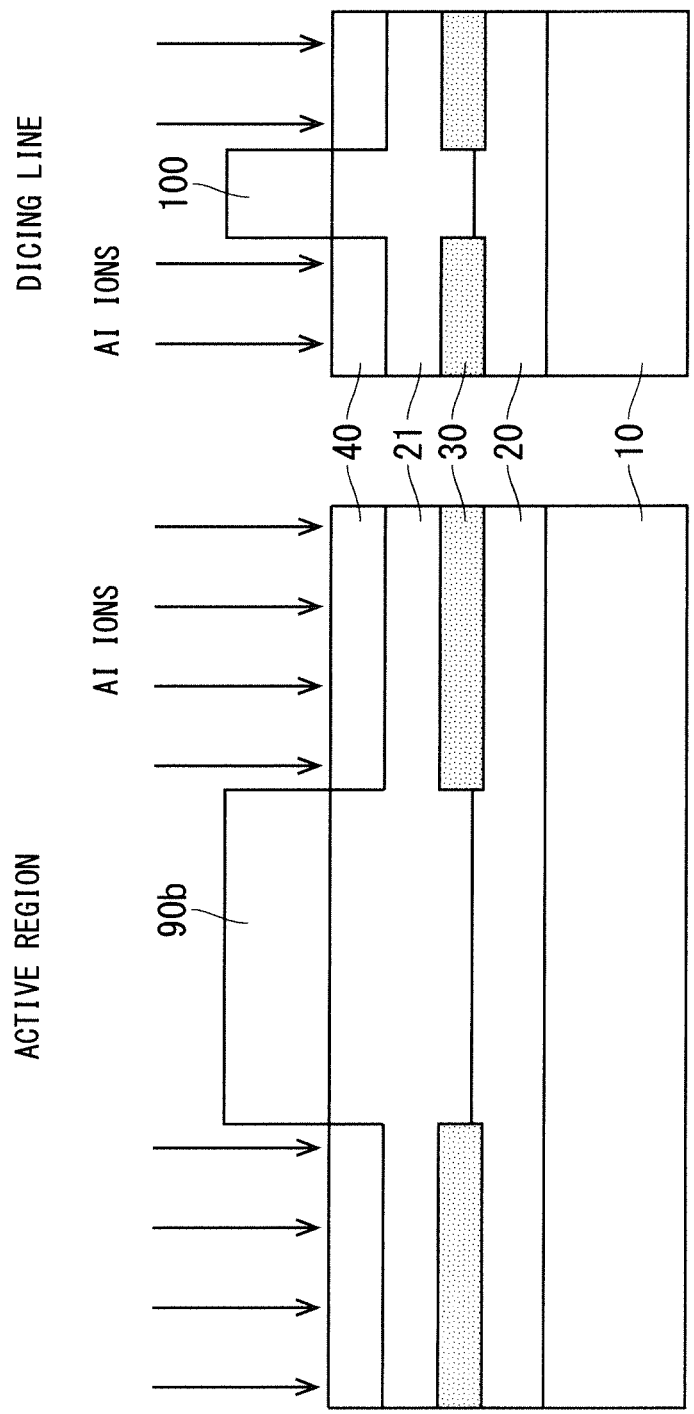

Referring to FIG. 11, an implantation mask 90b is formed on the upper surface of the JFET region 21 after removal of the implantation mask 90a. The implantation mask 90b is, for example, a hard mask formed by anisotropic etching such as dry etching. The perpendicularity of the sidewall of the implantation mask 90b is preferably high. When the implantation mask 90b is formed, the alignment mark 100 may be used as a reference.

An n-type source region 40 is formed in the surface layer of the JFET region 21 by ion-implanting N as an n-type impurity into the JFET region 21 in a state in which the implantation mask 90b is formed on the upper surface. At this time, the depth of the ion implantation of N is assumed to be shallower than the depth of a well region 31 formed in the subsequent step. The impurity concentration of the implanted N is, for example, in the range of $1 \times 10^{18}$ cm$^{-3}$ or more and $1 \times 10^{21}$ cm$^{-3}$ or less and exceeds the p-type impurity concentration of the well region 31. After ion implantation of N, the implantation mask 90b is removed.

Note that the implantation mask 90a illustrated in FIG. 10 may be used instead of the implantation mask 90b. In this case, the implantation mask 90b is not formed in the stage in FIG. 11 without removing the implantation mask 90a formed in FIG. 10. Using the implantation mask 90a also at the time of forming the source region 40 can reduce the number of masks and the manufacturing cost.

Figure 12:
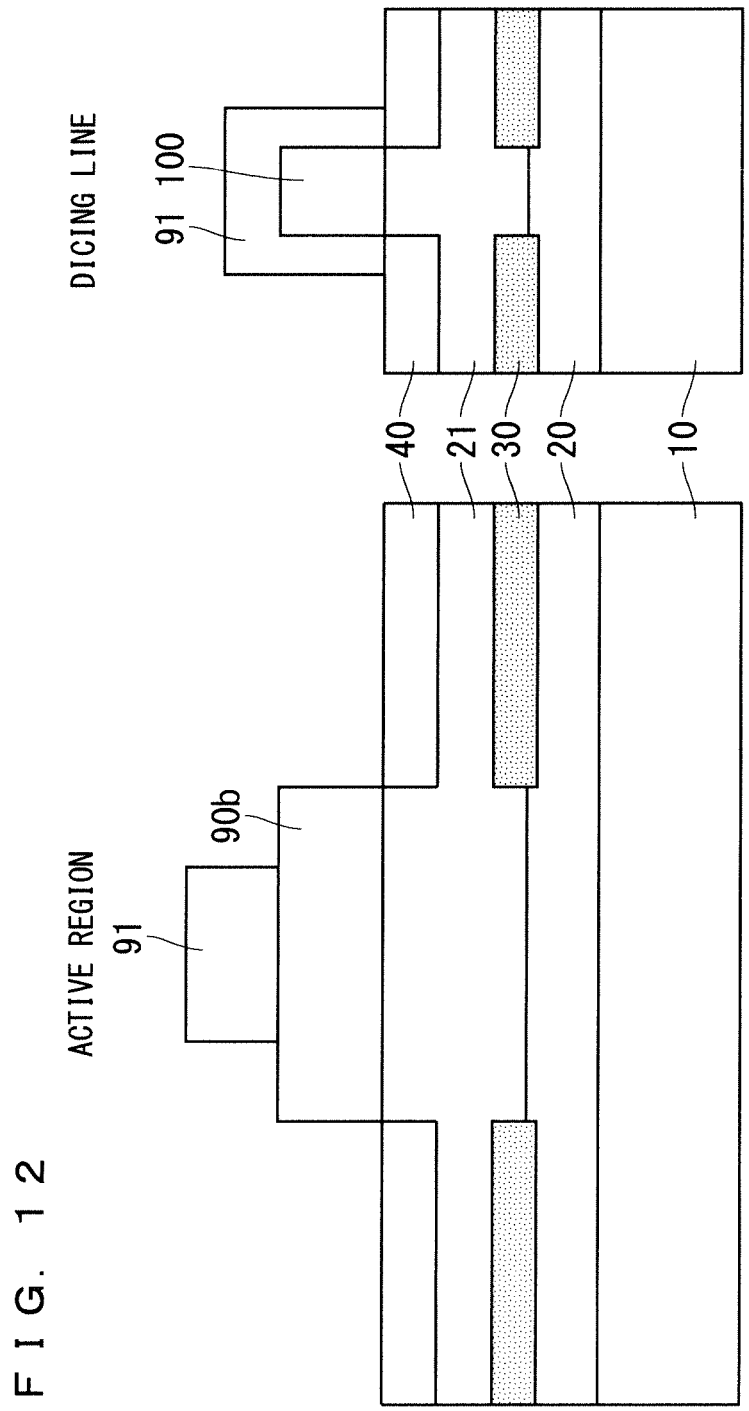

Referring to FIG. 12, an etching mask 91, which is a photoresist mask, is formed on the upper surface of the implantation mask 90b by photolithography with the alignment mark 100 as a reference. An implantation mask 90c, which is a hard mask, is formed by etching the implantation mask 90b, in a state in which the etching mask 91 is formed on the upper surface, by anisotropic etching such as dry etching. The perpendicularity of the sidewall of the implantation mask 90c is preferably high.

Forming the alignment mark 100 will improve the accuracy of the overlapping of the well region 31 and the source region 40. Accordingly, the variation in channel length is reduced, and hence the electrical characteristics of the semiconductor device can be stabilized.

In addition, as illustrated in FIGS. 11 and 12, ions are not implanted at the position of the alignment mark 100 on the dicing line. Therefore, it is possible to leave a trace when a semiconductor device is manufactured using the alignment mark 100.

Figure 13:
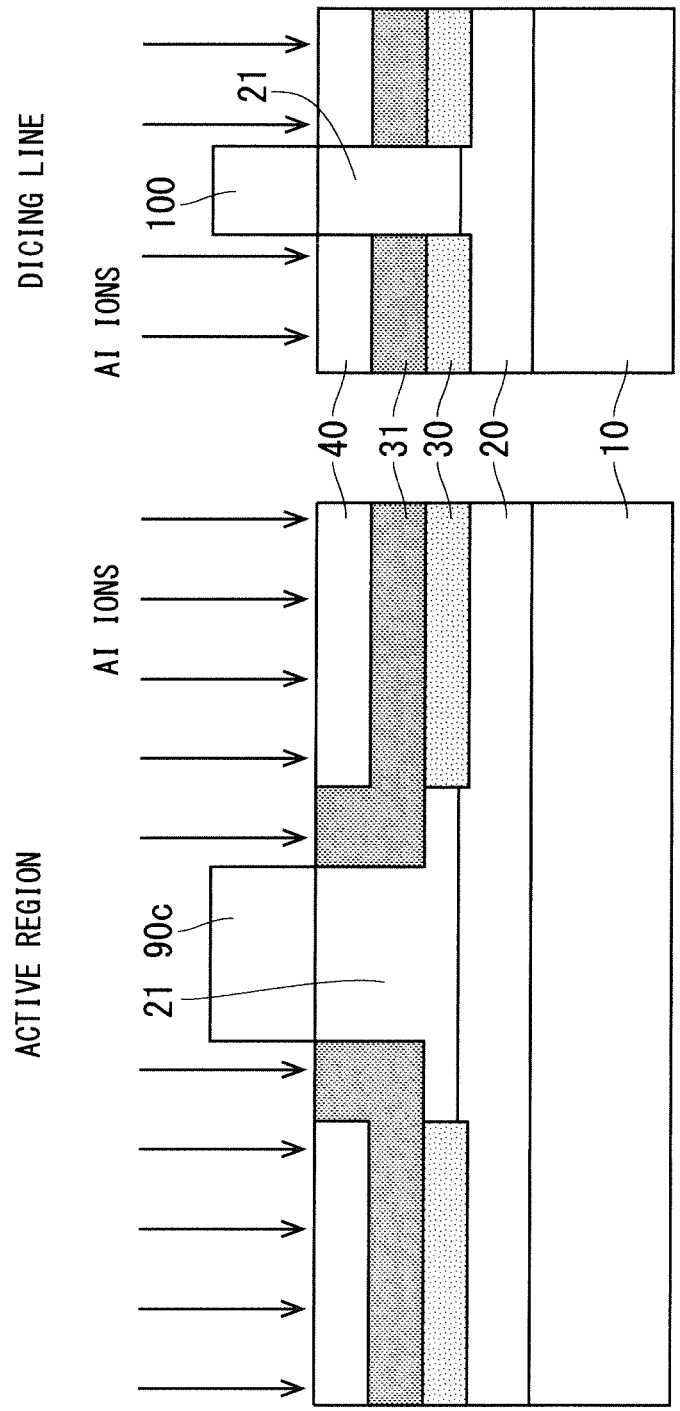

Referring to FIG. 13, after the etching mask 91 is removed, the p-type well region 31 is formed in the surface layer of the JFET region 21 by ion-implanting Al as a p-type impurity into the JFET region 21 in a state in which the implantation mask 90c is formed on the upper surface. At this time, the depth of Al ion implantation does not exceed the depth of the drift layer 20 and is, for example, 0.5 μm or more and 3 μm or less. Referring to FIG. 13, the well region 31 is formed deeper than the source region 40 and shallower than the well region 30. The impurity concentration of the implanted Al is, for example, in the range of $1 \times 10^{17}$ cm$^{-3}$ or more and $1 \times 10^{19}$ cm$^{-3}$ or less and exceeds the n-type impurity concentration of the drift layer 20.

After Al is ion-implanted, N ions may be implanted into a shallow region where a channel is formed in the well region 31 in order to adjust the threshold voltage.

After the removal of the implantation mask 90c, an implantation mask 90d is formed across the upper surface of the JFET region 21, the upper surface of the well region 31, and the upper surface of the source region 40. When the implantation mask 90d is formed, the alignment mark 100 may be used as a reference.

A p-type well contact region 32 is formed in the surface layer of the well region 31 by ion-implanting Al, which is a p-type impurity, into the source region 40 in a state in which the implantation mask 90d is formed on the upper surface. At this time, the depth of Al ion implantation is between the depth of the source region 40 and the depth of the well region 31.

An annealing treatment is performed in an atmosphere of an inert gas (argon (Ar) gas or the like) at, for example, 1300° C. or higher and 1900° C. or lower for, for example, 30 seconds or longer and 1 hour or shorter. This activates ion-implanted Al and N.

A gate oxide film 50 is formed by thermal oxidation across the upper surface of the HET region 21, the upper surface of the well region 31, and the upper surface of the source region 40. A polycrystalline silicon film having conductivity is formed on the upper surface of the gate oxide film 50. Further, a gate electrode 60 is formed by patterning the gate oxide film 50 and the polycrystalline silicon film.

Then, an interlayer insulating film 51 is formed so as to cover the gate electrode 60. A contact hole between the well contact region 32 and the source region 40 is formed by patterning.

Next, a metal film of nickel (Ni) or the like covering the interlayer insulating film 51, the well contact region 32, and the source region 40 is formed by a sputtering method, and heat treatment is performed at a temperature of, for example, 600° C. or higher and 1100° C. or lower. This forms a silicide between the silicon carbide layer and the metal film by causing Ni to react with silicon carbide. Subsequently, a metal film other than the silicide remaining on the upper surface of the interlayer insulating film 51 is removed by wet etching using a liquid mixture of a sulfuric acid hydrogen peroxide solution or the like. Performing this processing will form an ohmic electrode 70 on the upper surface side. The ohmic electrode 70 is formed to cover the well contact region 32 and the source region 40.

Metal wiring such as AlSi covering the interlayer insulating film 51 and the ohmic electrode 70 is formed by a sputtering method and further patterned to form a source electrode 80.

Figure 14:
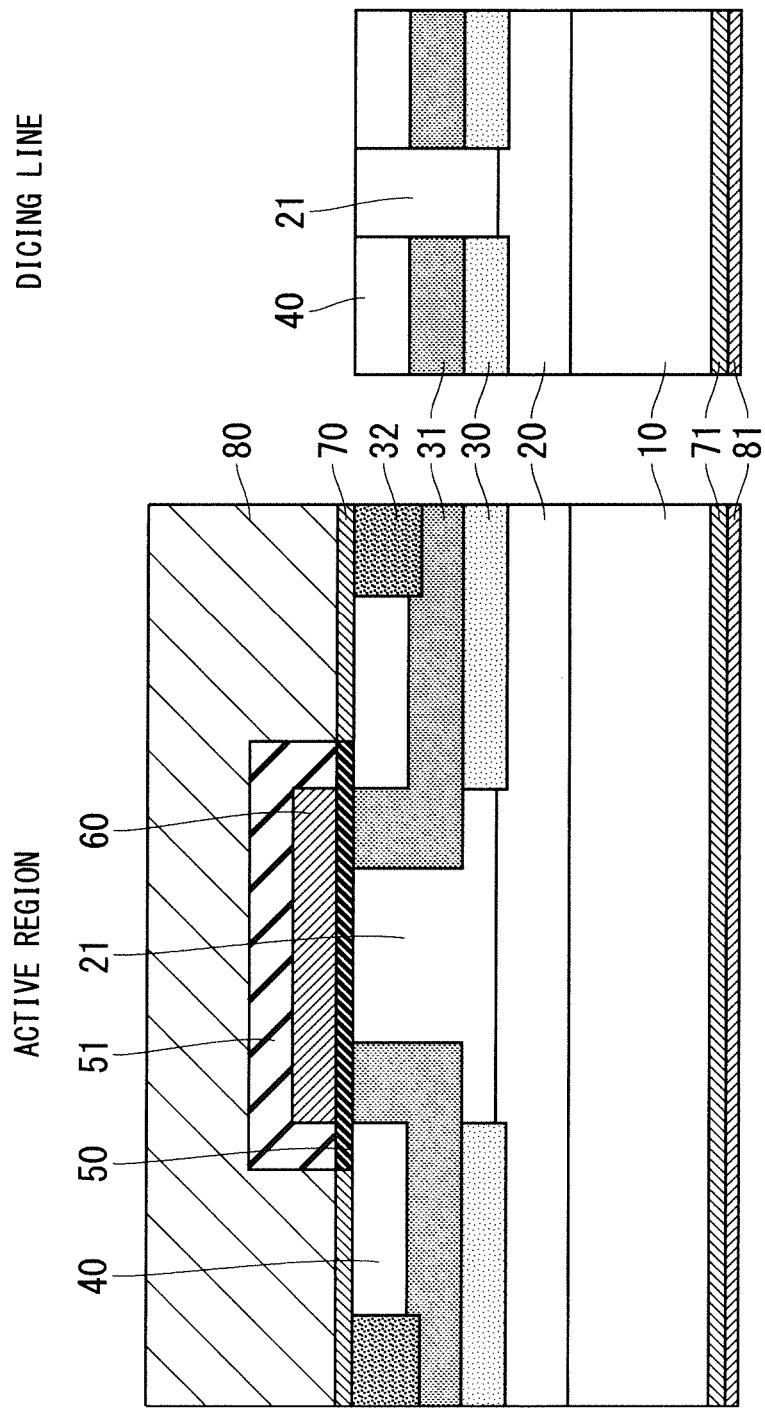

A metal film of Ti or the like covering the lower surface of the silicon carbide semiconductor substrate 10 is then formed by a sputtering method, and heat treatment is further performed to form an ohmic electrode 71 on the lower surface side. In addition, a drain electrode 81 is formed on the lower surface of the ohmic electrode 71 by sputtering Ni—Au. As illustrated in FIG. 14, this completes the configuration of the silicon carbide semiconductor device.

Third Preferred Embodiment

A method for manufacturing a silicon carbide semiconductor device according to the present preferred embodiment will be described below. Note that, in the following description, constituent elements similar to the constituent elements described in the preferred embodiment described above are denoted by the same reference numerals, and detailed description thereof will be omitted as appropriate.
<Configuration of Silicon Carbide Semiconductor Device and Method for Manufacturing the Same>

FIGS. 15 to 21 each are a cross-sectional view illustrating an example of a method for manufacturing a silicon carbide semiconductor device according to the present preferred embodiment. Note that a difference between the third preferred embodiment and the first preferred embodiment is that an implantation mask 90d is formed after a JFET region 21 is formed, and a p-type well contact region 32 is formed.

Referring to FIG. 15, first of all, on the upper surface of a silicon carbide semiconductor substrate 10, a drift layer 20 having an n-type impurity concentration of, for example, $1\times10^{15}$ cm$^{-3}$ or more and $1\times10^{17}$ cm$^{-3}$ or less and a thickness of, for example, 5 μm or more and 50 μm or less is epitaxially grown by the CVD method.

Figure 16:
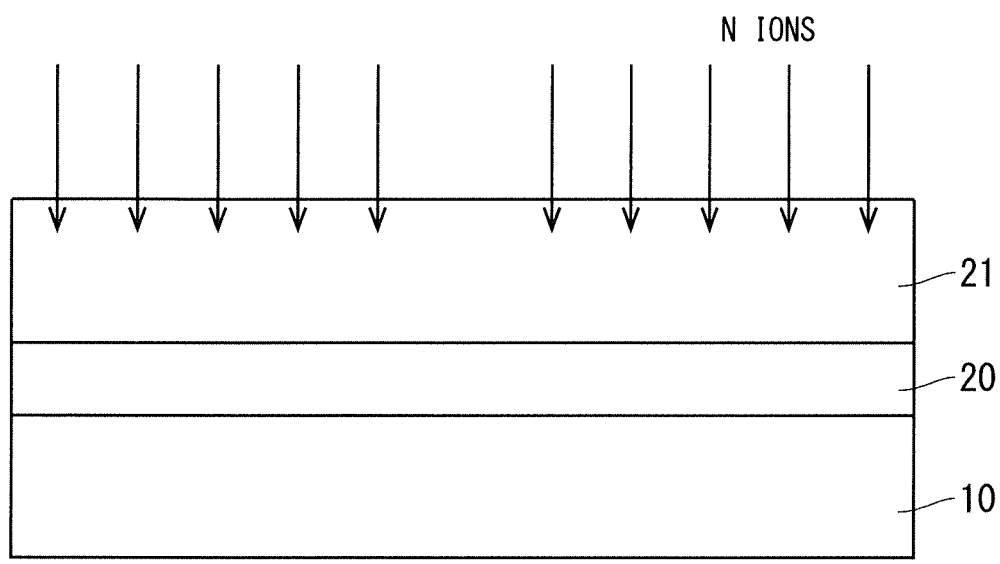

Referring to FIG. 16, N (nitrogen) as an n-type impurity is ion-implanted into the surface layer of a drift layer 20 to form the n-type JFET region 21 in the surface layer of the drift layer 20. At this time, the depth of the ion implantation of N is set not to exceed the depth of the well region 30 formed in a later step.

Figure 17:
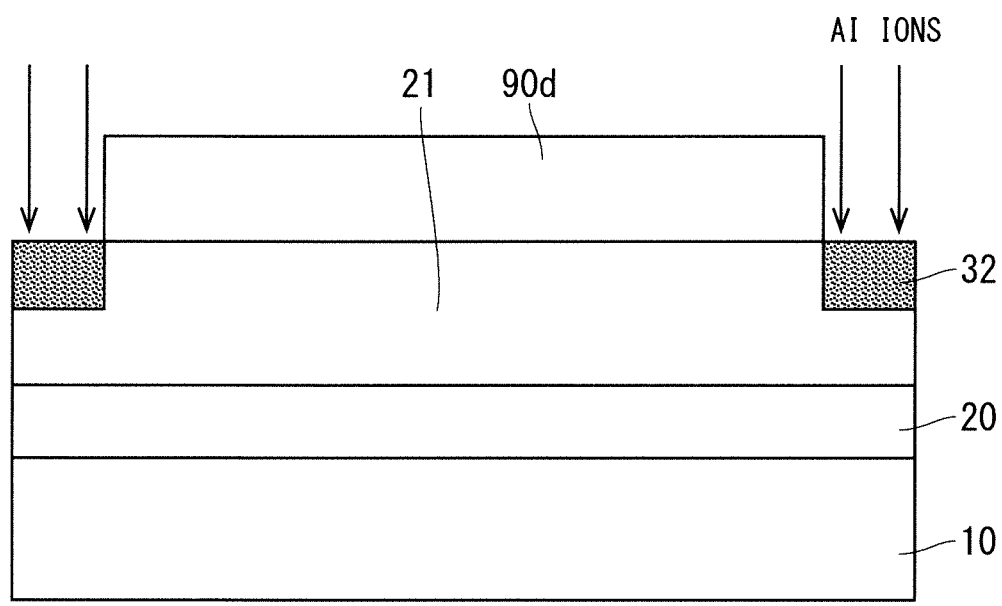

Referring to FIG. 17, a mask material is then formed on the upper surface of the JFET region 21 by a CVD method or the like. The type of mask material used here is not a photoresist but silicon oxide (SiO$_2$) or silicon nitride (SiN) serving as a hard mask.

A photoresist mask (that is, an etching mask for a mask material) is separately formed on the upper surface of the mask material, and an implantation mask 90d made of the mask material is formed by anisotropic etching such as dry etching. Note that the etching mask may be a hard mask instead of a photoresist mask. Furthermore, the perpendicularity of the sidewall of the implantation mask 90d is preferably high (i.e., vertical including substantially vertical).

The p-type well contact region 32 is formed in the surface layer of the JFET region 21 by ion-implanting Al as a p-type impurity into the JFET region 21 in a state in which the implantation mask 90d is formed on the upper surface. At this time, the depth of the ion implantation of Al is set between the depth of a source region 40 and the depth of a well region 31 both formed in a subsequent step. When Al is ion-implanted, it is preferable to heat the silicon carbide semiconductor substrate 10, on which the drift layer 20 is formed, to 150° C. or higher in order to reduce the resistance of the well contact region 32.

According to the above description, since the number of steps of forming the mask using the mask material such as TEOS can be reduced by one, the manufacturing cost of the semiconductor device can be reduced.

Figure 18:
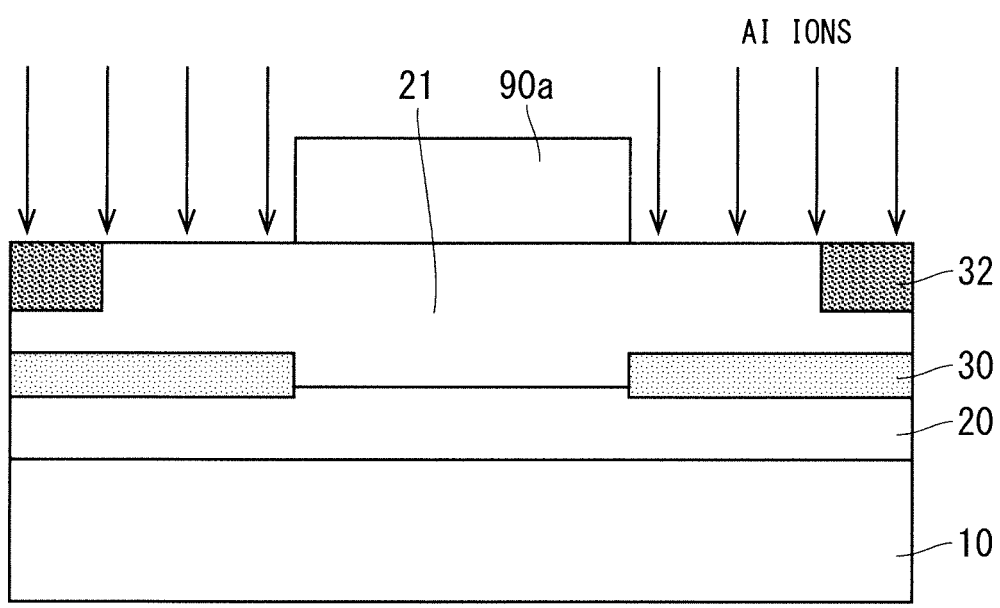

Referring to FIG. 18, an etching mask is separately formed on the upper surface of the implantation mask 90d, and an implantation mask 90a having a larger opening area than the implantation mask 90d is formed by anisotropic etching such as dry etching. The implantation mask 90d may be anisotropically etched to form the implantation mask 90c although the execution order is different from that in the case described in the present preferred embodiment.

Al ions of a p-type impurity are implanted into the JFET region 21 having an upper surface on which the implantation mask 90a is formed to form the p-type well region 30. The depth of the ion implantation of Al does not exceed the depth of the drift layer 20 and may be, for example, a depth having a peak of 0.6 μm or more and 4 μm or less. The impurity concentration of ion-implanted Al is higher than the n-type impurity concentration of drift layer 20. After ion implantation of Al, the implantation mask 90a is removed.

Referring to FIG. 19, the n-type source region 40 is formed in the surface layer of the JFET region 21 by ion-implanting N as an n-type impurity into the JFET region 21 in a state in which an implantation mask 90b is formed on the upper surface. At this time, the depth of the ion implantation of N is assumed to be shallower than the depth of a well region 31 formed in the subsequent step. The impurity concentration of the implanted N is, for example, in the range of $1\times10^{18}$ cm$^{-3}$ or more and $1\times10^{21}$ cm$^{-3}$ or less and exceeds the p-type impurity concentration of the well region 31.

Note that the implantation mask 90a illustrated in FIG. 18 may be used instead of the implantation mask 90b. In this case, the implantation mask 90b is not formed in the stage in FIG. 19 without removing the implantation mask 90a formed in FIG. 18. Using the implantation mask 90a also at the time of forming the source region 40 can reduce the number of masks and the manufacturing cost.

Figure 20:
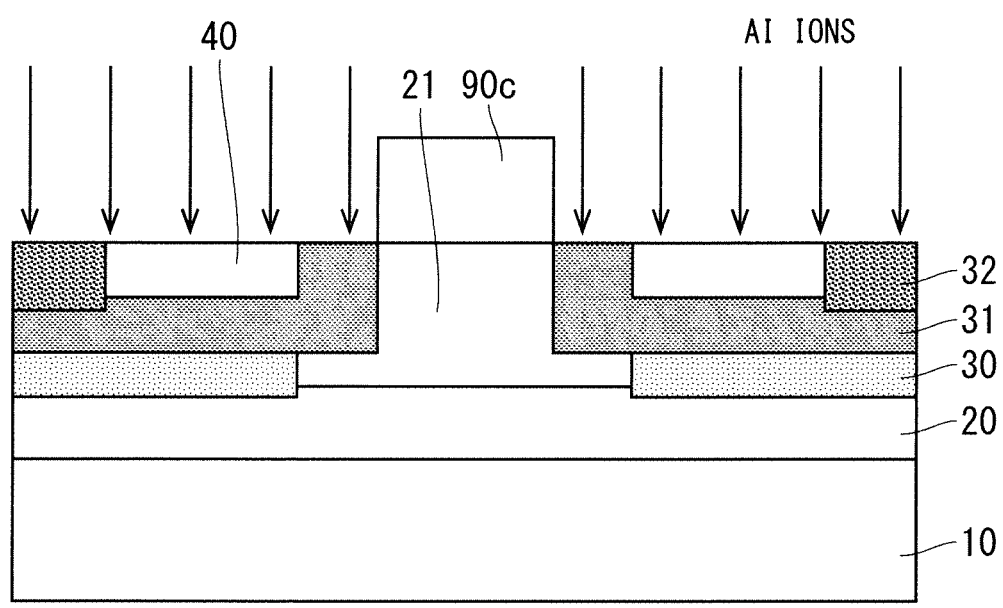

Referring to FIG. 20, an etching mask (not illustrated), which is a photoresist mask, is formed on the upper surface of the implantation mask 90b. The implantation mask 90b in a state in which an etching mask is formed on the upper surface is etched by anisotropic etching such as dry etching, and an implantation mask 90c having an opening area larger than that of the implantation mask 90b is formed. The perpendicularity of the sidewall of the implantation mask 90c is preferably high.

The p-type well region 31 is formed in the surface layer of the JFET region 21 by ion-implanting Al as a p-type impurity into the JFET region 21 in a state in which the implantation mask 90c is formed on the upper surface. At this time, the depth of Al ion implantation does not exceed the depth of the drift layer 20 and is, for example, 0.5 μm or more and 3 μm or less. Referring to FIG. 20, the well region 31 is formed deeper than the source region 40 and shallower than the well region 30. The impurity concentration of the implanted Al is, for example, in the range of $1\times10^{17}$ cm$^{-3}$ or more and $1\times10^{19}$ cm$^{-3}$ or less and exceeds the n-type impurity concentration of the drift layer 20.

After Al is ion-implanted, N ions may be implanted into a shallow region where a channel is formed in the well region 31 in order to adjust the threshold voltage.

After the removal of the implantation mask 90c, an implantation mask 90d is formed across the upper surface of the JFET region 21, the upper surface of the well region 31, and the upper surface of the source region 40.

A p-type well contact region 32 is formed in the surface layer of the well region 31 by ion-implanting Al, which is a p-type impurity, into the source region 40 in a state in which the implantation mask 90d is formed on the upper surface. At this time, the depth of Al ion implantation is between the depth of the source region 40 and the depth of the well region 31.

An annealing treatment is performed in an atmosphere of an inert gas (argon (Ar) gas or the like) at, for example, 1300° C. or higher and 1900° C. or lower for, for example, 30 seconds or longer and 1 hour or shorter. This activates ion-implanted Al and N.

A gate oxide film 50 is formed by thermal oxidation across the upper surface of the JFET region 21, the upper surface of the well region 31, and the upper surface of the source region 40. A polycrystalline silicon film having conductivity is formed on the upper surface of the gate oxide film 50. Further, a gate electrode 60 is formed by patterning the gate oxide film 50 and the polycrystalline silicon film.

Then, an interlayer insulating film 51 is formed so as to cover the gate electrode 60. A contact hole between the well contact region 32 and the source region 40 is formed by patterning.

Next, a metal film of nickel (Ni) or the like covering the interlayer insulating film 51, the well contact region 32, and the source region 40 is formed by a sputtering method, and heat treatment is performed at a temperature of, for example, 600° C. or higher and 1100° C. or lower. This forms a silicide between the silicon carbide layer and the metal film by causing Ni to react with silicon carbide. Subsequently, a metal film other than the silicide remaining on the upper surface of the interlayer insulating film 51 is removed by wet etching using a liquid mixture of a sulfuric acid hydrogen peroxide solution or the like. Performing this processing will form an ohmic electrode 70 on the upper surface side. The ohmic electrode 70 is formed to cover the well contact region 32 and the source region 40.

Metal wiring such as AlSi covering the interlayer insulating film 51 and the ohmic electrode 70 is formed by a sputtering method and further patterned to form a source electrode 80.

Figure 21:
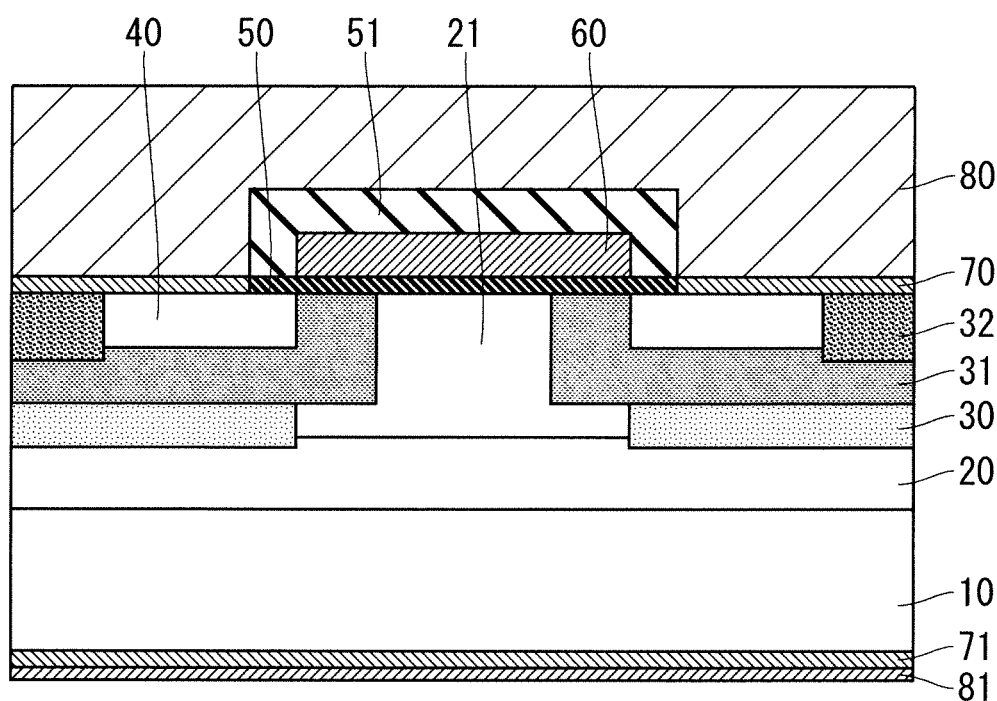

A metal film of Ti or the like covering the lower surface of the silicon carbide semiconductor substrate 10 is then formed by a sputtering method, and heat treatment is further performed to form an ohmic electrode 71 on the lower surface side. In addition, a drain electrode 81 is formed on the lower surface of the ohmic electrode 71 by sputtering Ni—Au. As illustrated in FIG. 21, this completes the configuration of the silicon carbide semiconductor device.

Referring to FIGS. 15 to 21, an alignment mark on a dicing line may be formed as in the second preferred embodiment, and the alignment mark may be used as a reference for dry etching or the like using the implantation mask 90b.

<Effects Produced by Preferred Embodiments Described Above>

The effects produced by the above preferred embodiments will be described next. Note that, in the following description, the effects will be described based on the specific configurations exemplified in the preferred embodiments described above, but the configurations may be replaced with other specific configurations exemplified in the present specification as long as similar effects are produced. That is, in the following description, for convenience, only one of the associated specific configurations may be described as a representative, but the specific configuration described as a representative may be replaced with another specific configuration associated.

Furthermore, the replacement may be performed across a plurality of preferred embodiments. That is, the same effect may be produced by combining the respective configurations exemplified in different preferred embodiments.

According to the preferred embodiment described above, in the method for manufacturing the silicon carbide semiconductor device, the drift layer 20 is formed on the upper surface of the silicon carbide semiconductor substrate 10. A hard mask is then formed on the upper surface of the drift layer 20 by anisotropic etching. In this case, the hard mask corresponds to, for example, at least one of the implantation mask 90a, the implantation mask 90b, the implantation mask 90c, the implantation mask 90d, and the like. Ions are implanted into the drift layer 20 in a state in which the hard mask is formed, thereby forming a first ion implantation region in the surface layer of the drift layer 20. In this case, the first ion implantation region corresponds to, for example, at least one of the well region 30, the source region 40, the well region 31, the well contact region 32, and the like. In this case, the hard mask includes a sidewall perpendicular to the upper surface of the drift layer 20.

According to such a configuration, using a hard mask having a sidewall having high perpendicularity at the time of ion implantation will make the hard mask less likely to have a forward tapered portion. This makes it possible to prevent ions implanted using the mask from being implanted to a depth shallower than the target depth. Therefore, an increase in the threshold voltage or the on-voltage can be effectively suppressed. This can suppress variations in the electrical characteristics of the semiconductor device.

Note that, in a case in which there is no particular limitation, the order in which each processing is performed can be changed.

The same effect can be obtained even when another configuration exemplified in the present specification is appropriately added to the above configuration, that is, even when another configuration not mentioned as the above configuration in the present specification is appropriately added.

According to the preferred embodiment described above, forming the drift layer 20 is to form the drift layer 20 of the first conductivity type (n-type). Forming the first ion implantation region is to form the well region 30, the well region 31, or the well contact region 32 by implanting ions of the second conductivity type (p-type) into the drift layer 20 in a state in which the implantation mask 90a, the implantation mask 90c, or the implantation mask 90d is formed. According to such a configuration, using a hard mask having a sidewall having high perpendicularity at the time of p-type ion implantation will make the hard mask less likely to have a forward tapered portion. This makes it possible to prevent p-type ions implanted using the hard mask from being implanted to a depth shallower than the target depth.

According to the preferred embodiment described above, in the method for manufacturing a silicon carbide semiconductor device, n-type ions are implanted into the drift layer 20 in a state in which the implantation mask 90a is formed, thereby forming the source region 40 having an impurity concentration higher than that of the drift layer 20 in the surface layer of the drift layer 20. According to such a configuration, forming the source region 40 and the well region 30 using the same implantation mask 90a can reduce the number of masks to be used. This can reduce the manufacturing cost of the semiconductor device. In addition, when the source region 40 is formed, using a hard mask having high perpendicularity can eventually suppress variations in the electrical characteristics of the semiconductor device.

According to the preferred embodiment described above, in the method for manufacturing a silicon carbide semiconductor device, a part of the hard mask is removed by photolithography and dry etching. Forming the well region 30 or the well region 31 in the surface layer of the drift layer 20 by implanting p-type ions into the drift layer 20 in a state in which the partially removed hard mask is formed. According to such a configuration, partially removing a hard mask allows the use of the hard mask for ion implantations using masks having different widths. Accordingly, the number of masks used can be reduced. This can reduce the manufacturing cost of the semiconductor device. In addition, when both ion implantation regions are formed, it is possible to prevent ions implanted using the mask from being implanted to a depth shallower than a target depth.

According to the preferred embodiment described above, the silicon carbide semiconductor substrate 10 includes an active region and a dicing line removed by dicing. Then, forming the hard mask is to form the implantation mask 90a, the implantation mask 90b, or the implantation mask 90d in the active region and form the alignment mark 100 on the dicing line. Removing a part of the hard mask is to remove a part of the implantation mask 90a, the implantation mask 90b, or the implantation mask 90d with the alignment mark 100 as a reference. According to such a configuration, the etching mask 91 can be formed with the alignment mark 100 as a reference, and a part of the implantation mask 90b can be removed using the etching mask 91. Therefore, the accuracy of the overlapping of the well region 31 and the source region 40 is improved. This can suppress variations in the electrical characteristics of the semiconductor device. Since ions are not implanted immediately below the alignment mark 100 on the dicing line, a trace indicating that the manufacturing method is used remains on the dicing line of the semiconductor device formed by the manufacturing method.

According to the preferred embodiment described above, removing a part of the hard mask is to remove a part of the implantation mask 90d after forming the well contact region 32 using the implantation mask 90d. Forming the second ion implantation region is to form the well region 30 or the well region 31 by implanting ions in a state in which the partially removed implantation mask 90a or implantation mask 90c is formed. According to such a configuration, partially removing the implantation mask 90d used for forming the well contact region 32 makes it possible to use the implantation mask 90a (or the implantation mask 90b) formed by the removal for the formation of the well region 30 (or the well region 31). Accordingly, the number of masks used can be reduced. This can reduce the manufacturing cost of the semiconductor device. In addition, when both ion implantation regions are formed, it is possible to prevent ions implanted using the mask from being implanted to a depth shallower than a target depth.

According to the preferred embodiment described above, forming the drift layer 20 is to form the n-type drift layer 20. Forming the first ion implantation region is to form the source region 40 having an impurity concentration higher than that of the drift layer 20 by implanting n-type ions into the drift layer 20 in a state in which the implantation mask 90b is formed. According to such a configuration, using the implantation mask 90b having a sidewall having high perpendicularity at the time of n-type ion implantation will make the implantation mask 90b less likely to have a forward tapered portion. This makes it possible to prevent n-type ions implanted using the implantation mask 90b from being implanted to a depth shallower than the target depth.

Modifications of Preferred Embodiments Described Above

In the preferred embodiments described above, material qualities, materials, dimensions, shapes, relative arrangement relationships, implementation conditions, and the like of the respective components may also be described, but each of them is one example in all aspects and is not restrictive.

Accordingly, numerous modifications and equivalents, examples of which are not illustrated, are contemplated within the scope of the technology disclosed in this specification. For example, the present invention includes a case in which at least one constituent element is modified, added, or omitted and a case in which at least one constituent element in at least one preferred embodiment is extracted and combined with a constituent element in another preferred embodiment.

In addition, in the preferred embodiments described above, in a case in which a material name or the like is described without being particularly specified, unless there is a contradiction, the material includes other additives, for example, an alloy.

Unless there is a contradiction, when it is described in the above preferred embodiments that "one" constituent element is provided, "one or more" constituent elements may be provided.

Each constituent element in the preferred embodiments described above is a conceptual unit, and the scope of the technology disclosed in the present specification includes a case in which one constituent element includes a plurality of structures, a case in which one constituent element corresponds to a part of a certain structure, and a case in which a plurality of constituent elements are provided for one structure.

In addition, each constituent element in the preferred embodiments described above includes a structure having another structure or shape as long as the same function is exhibited.

In addition, the description of the present specification is referred to for all purposes related to the present technology, and none of them is recognized as prior art. Further, in the preferred embodiment described above, it has been described that the first conductivity type is n-type and the second conductivity type is p-type, but conversely the first conductivity type may be p-type and the second conductivity type may be n-type.

In addition, in the preferred embodiment described above, the planar type MOSFET has been described, but it is also assumed that the present invention is applied to a trench type MOSFET in which a trench is formed in the upper surface of the drift layer 20. When the present invention is applied to a trench type MOSFET, a groove, that is, a trench is formed in the upper surface of the drift layer 20, and a gate electrode is embedded in the groove. The gate electrode is embedded between the bottom surface and the side surface of the trench through a gate insulating film.

While the specification has been shown and described in detail, the foregoing description is in all aspects illustrative and not restrictive. It is therefore understood that numerous modifications and variations can be devised.

What is claimed is:

1. A method for manufacturing a silicon carbide semiconductor device, the method comprising:
   forming a drift layer on an upper surface of a silicon carbide semiconductor substrate;
   forming a hard mask on an upper surface of the drift layer by anisotropic etching;
   forming a first ion implantation region in a surface layer of the drift layer by implanting ions into the drift layer in a state in which the hard mask is formed; and
   after forming the first ion implantation region, forming a second ion implantation region above the first ion implantation region by implanting ions into the silicon carbide semiconductor substrate in the state in which the hard mask is formed,
   wherein the hard mask comprises a sidewall perpendicular to the upper surface of the drift layer.

2. The method for manufacturing a silicon carbide semiconductor device according to claim 1, wherein forming the drift layer is to form the drift layer of a first conductivity type, forming the first ion implantation region is to form the first ion implantation region of a second conductivity type by implanting ions of the second conductivity type into the drift layer in the state in which the hard mask is formed.

3. The method for manufacturing a silicon carbide semiconductor device according to claim 2, wherein the second ion implantation region is a source region of the first conductivity type having an impurity concentration higher than that of the drift layer in a surface layer of the drift layer and is formed by implanting ions of the first conductivity type into the drift layer in the state in which the hard mask is formed.

4. The method for manufacturing a silicon carbide semiconductor device according to claim 2, further comprising:
   removing a part of the hard mask by photolithography and dry etching; and
   wherein the second ion implantation region is of the second conductivity type, is in a surface layer of the drift layer, and is formed by implanting ions of the second conductivity type into the drift layer in a state in which the partially removed hard mask is formed.

5. The method for manufacturing a silicon carbide semiconductor device according to claim 4, wherein the silicon carbide semiconductor substrate includes an active region and a dicing line to be removed by dicing, and
   the forming the hard mask is to form the hard mask in the active region and form an alignment mark on the dicing line, and
   removing the part of the hard mask is to remove the part of the hard mask with reference to the alignment mark.

6. The method for manufacturing a silicon carbide semiconductor device according to claim 4, wherein removing the part of the hard mask is to remove the part of the hard mask after forming a well contact region as the first ion implantation region using the hard mask, and
   forming the second ion implantation region is to form a well region as the second ion implantation region by implanting ions in the state in which the partially removed hard mask is formed.

7. The method for manufacturing a silicon carbide semiconductor device according to claim 1, wherein forming the drift layer is to form the drift layer of a first conductivity type, forming the first ion implantation region is to form the first ion implantation region of the first conductivity type having an impurity concentration higher than that of the drift layer by implanting ions of the first conductivity type into the drift layer in the state in which the hard mask is formed.

8. The method for manufacturing a silicon carbide semiconductor device according to claim 3, further comprising:
   removing a part of the hard mask by photolithography and dry etching; and
   the second ion implantation region is of the second conductivity type, is in a surface layer of the drift layer, and is formed by implanting ions of the second conductivity type into the drift layer in a state in which the partially removed hard mask is formed.

9. The method for manufacturing a silicon carbide semiconductor device according to claim 5, wherein removing the part of the hard mask is to remove the part of the hard mask after forming a well contact region as the first ion implantation region using the hard mask, and
   forming the second ion implantation region is to form a well region as the second ion implantation region by implanting ions in the state in which the partially removed hard mask is formed.

10. The method for manufacturing a silicon carbide semiconductor device according to claim 1, wherein the silicon carbide semiconductor device is a JFET.

* * * * *